United States Patent [19]

Kaloi et al.

[11] Patent Number: 5,511,000
[45] Date of Patent: Apr. 23, 1996

[54] ELECTRONIC SOLID-STATE RECORD/PLAYBACK DEVICE AND SYSTEM

[76] Inventors: Dennis M. Kaloi, 710 N. Oak Point Dr.; Richard A. Simon, 707 Clear Haven Dr., both of Agoura Hills, Calif. 91301

[21] Appl. No.: 154,357

[22] Filed: Nov. 18, 1993

[51] Int. Cl.⁶ .................................................. G06F 19/00
[52] U.S. Cl. ...................................... 364/514 A; 395/2.1
[58] Field of Search ............................... 84/602; 360/32; 364/514, 514 A; 379/88; 395/2.1

[56] References Cited

U.S. PATENT DOCUMENTS

| | | | |
|---|---|---|---|
| 3,007,149 | 10/1961 | Brown | 360/32 X |
| 4,255,618 | 3/1981 | Danner et al. | 379/88 X |
| 4,965,569 | 10/1990 | Bennett et al. | 379/88 X |
| 5,045,327 | 9/1991 | Tarlow et al. | 395/2.1 X |
| 5,359,698 | 10/1994 | Goldberg et al. | 395/2.1 |

*Primary Examiner*—Edward R. Cosimano
*Attorney, Agent, or Firm*—Beehler & Pavitt

[57] ABSTRACT

An improved electronic solid-state record/playback device (SSRPD) and electronic system may be used to record and playback information such as audio, video, control, and other data. The SSRPD uses no tape or moving parts in the actual record/playback process but includes an audio and/or video and/or other data record/playback module (RPM), which performs all of the record signal conversion, recording and data compression algorithms, digital signal processing, and playback signal conversion. The SSRPD has program input processing and control output processing modules so that other devices may be controlled in different ways including interactive control. A time and control processor module facilitates internal synchronization of the SSRPD audio, video, and control information, as well as synchronization with other devices. The SSRPD information described is recorded into an internal resident memory(s). The novel interface allows information to be exchanged without degradation via a digital Portable Storage Device (PSD) which may be a Random Access Memory card (RAM card), with other SSRPDs as well as to a special Computer Interface Device (CID). The CID is an intelligent device that connects to a standard computing device such as a PC and facilitates functions such as reading, writing, editing, and archiving PSD data, as well as performing diagnostic routines.

14 Claims, 32 Drawing Sheets

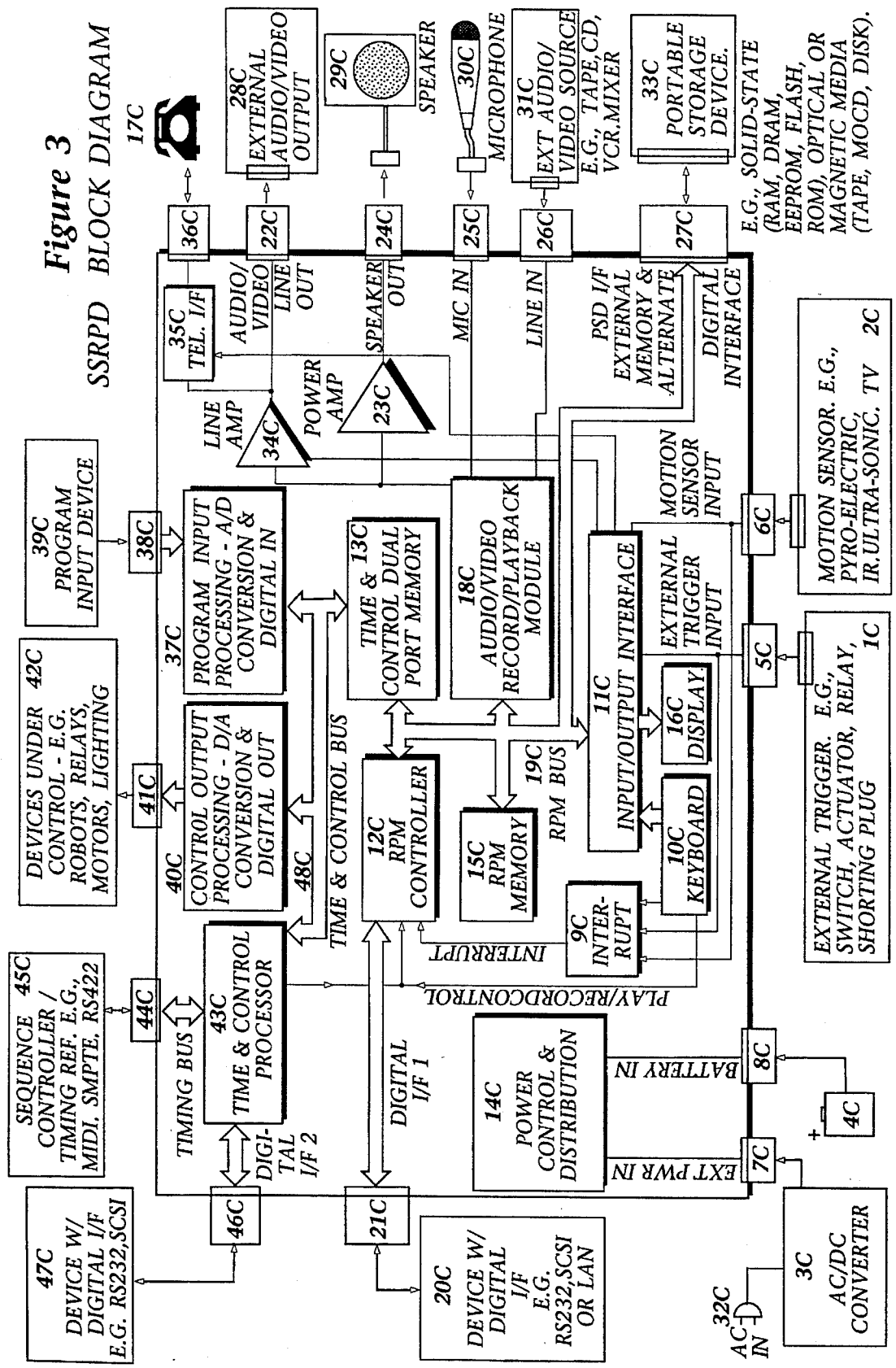
*Figure 3* SSRPD BLOCK DIAGRAM 17C

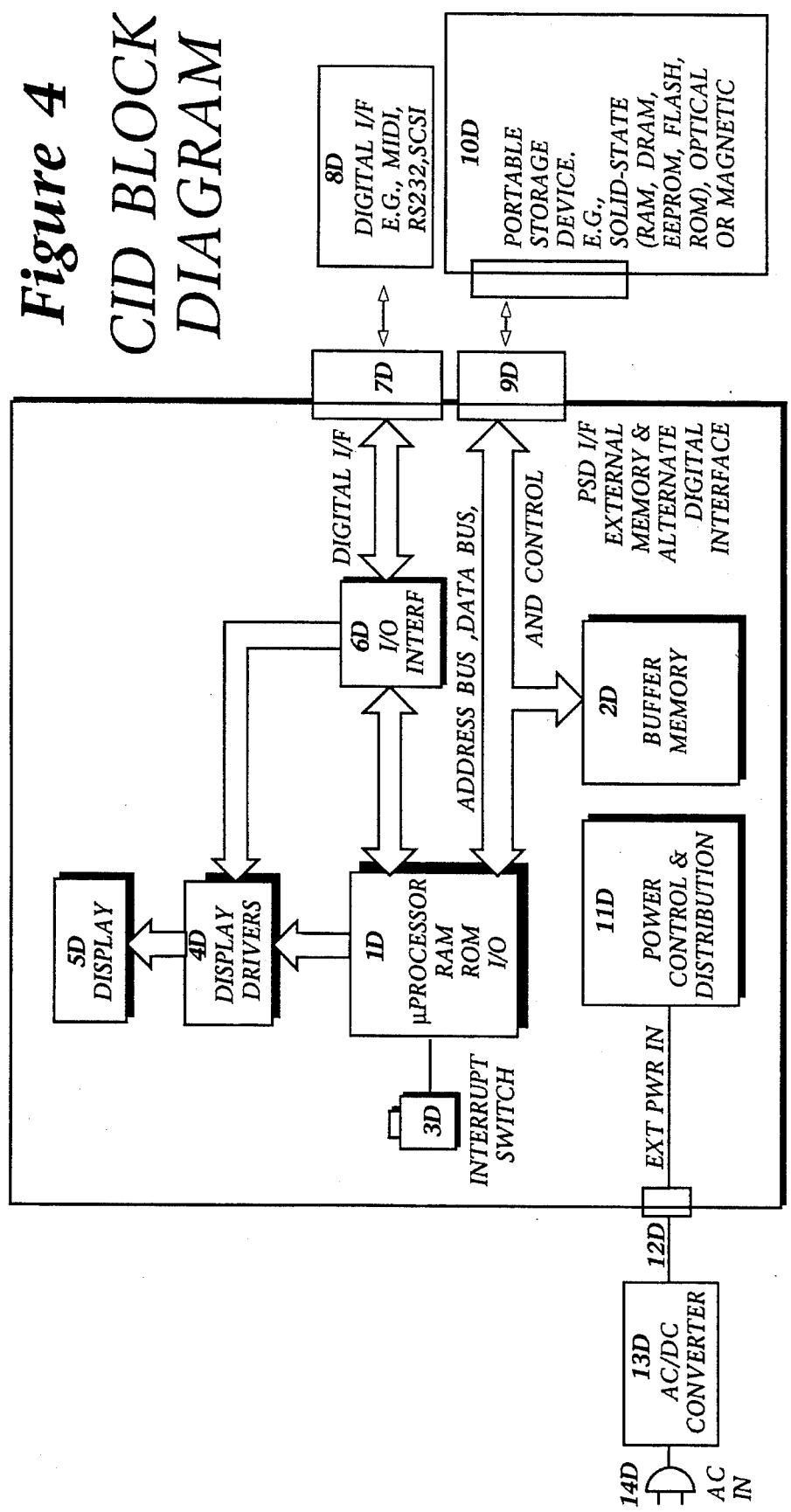

POWER SUPPLY SECTION

Figure 14-4

COMMAND EXAMPLES

KEYBOARD FUNCTIONS:
- <BREAK>   • ABORT COMMAND
- <CTRL> H   • BACKSPACE
- <CTRL> S   • FREEZE SCREEN
- <CTRL> X   • CANCEL COMMAND LINE
- <RETURN>   • ENTER COMMAND

RANGELESS COMMANDS:
- WRITE <SRECORD>                    • WRITE USING STANDARD PSD FORMAT
- MMWRITE <MESSAGE>                  • WRITE USING SSRPD FORMAT
- TEST                                • SELF TEST CID AND TEST PSD
- SWAP <MESSAGEx> <MESSAGEy>          • SWAP MESSAGE X AND MESSAGE Y
- KILL <MESSAGE> [<MESSAGE>...]      • DELETE MESSAGE(S) ON PSD
- VERIFY <SRECORD>                   • VERIFY SRECORD AGAINST PSD MEMORY
- CLIP <MESSAGE> <SECS>              • TRUNCATE MESSAGE BY n SECONDS
- SD                                  • SET DEFAULT PARAMETERS
- SL                                  • SET LOAD PARAMETERS
- MESSAGE                             • DISPLAY SSRPD MEMORY USE

RANGE COMMANDS:
- READ [<START ADDRESS>] [<END ADDRESS>]              • READ USING STANDARD PSD FORMAT
- MMREAD [<MESSAGE>] [< ADDRESS>]                     • READ USING SSRPD FORMAT
- DISPLAY <START ADDRESS> [<END ADDRESS>]             • DISPLAY MEMORY CONTENTS
- MODIFY <ADDRESS>                                    • MODIFY MEMORY LOCATION
- BF <START ADDRESS> <END ADDRESS> <DATA>             • BLOCK FILL

ELECTRONIC SOLID-STATE RECORD/PLAYBACK DEVICE AND SYSTEM

BACKGROUND OF THE INVENTION

Audio, video, and data recording devices are well known and of several varieties. Magnetic tape, magnetic and optical disk, are just some of the well known mediums for devices which may record and playback such data. More recently, the ability to record and playback information using a solid-state RPM and memory device has been achieved. Integrated circuit (IC) companies for example, have recently introduced audio Record/Playback Modules (RPMs) on a single Very Large Scale Integration (VLSI) integrated circuit. By the addition of solid-state memory, devices have been constructed which record and playback or just playback audio signals.

Unlike their magnetic, optical, and similar medium counterparts, these devices have no moving parts to wear out. They have been used in many applications which include public safety annunciators, point-of-sale advertising, phone message devices, and other message repeater devices. In general, the message device or SSRPD has a trigger input to activate the message and a signal output which is usually a speaker or analog line output which may be connected to another signal input such as a power amplifier.

Although much of this disclosure of this invention refers to audio and similar analog information as the message information it should be understood that this invention is not limited to audio and is intended to cover a much broader spectrum. Most of the record/playback VLSIs currently available are audio devices. Video and/or audio VLSI devices are on the horizon, however, RPMs may currently be constructed with discrete circuitry and building blocks that may perform the same types of functions with audio, video, and other data in the same or similar manner as currently available audio VLSIs.

With regard to message devices, RPMs and SSRPDs, there are basically two types of devices currently available. The first type is a playback-only device (POD), which contains a read only memory (ROM). The message information is programmed into the memory device by a separate development system. In the case of electrically programmable read only memory (EPROM) or electrically erasable programmable read only memory (EEPROM), the memory device may only be programmed or reprogrammed by the development system. The POD may only read (playback) from the memory but cannot write (record) to it. Messages may be changed in the POD by replacing the memory device, but that new memory device must stay with the machine. This is often accomplished by inserting the programmed memory circuitry into a connector socket or using a cartridge which plugs into a connector resident in the POD. Therefore, if it is desired to change messages in 100 machines one must replace the memories in the 100 machines with 100 newly programmed or reprogrammed memories. The necessity having to produce individual memory devices for each playback unit is a significant and relevant shortcoming of this type of arrangement. Another shortcoming with these devices is the development system. One must have a development system to program messages into memory. These systems generally consist of a computing device, special software, and a programmer device to program the memories.

The second type of device that currently exists is the stand alone SSRPD. These devices contain a resident memory which may be written to (record) as well as read from (playback). The SSRPD contains a Record/Playback Module (RPM), which performs all of the record signal conversion such as analog to digital (A/D), recording and data compression algorithms, digital signal processing, and playback signal conversion such as digital to analog (D/A). In general, the resident memory is directly connected to the RPM rather than part of a more complex bus architecture.

These units have an analog input(s) to be able to record source information, and analog output(s) which provide the message output. However, these devices have no means for transferring message and other information in its digital form. Since these devices only contain analog inputs and outputs, the only way to exchange information from one unit to another is through a separate record/playback device with an analog input and output. For example, a tape recorder might be used to copy from one unit to others but the conversion from digital to analog, copying to tape, and then converting analog to digital in another SSRPD causes degradation. The lack of a direct digital transfer interface also requires that another record/playback device such as a tape recorder is needed to archive message information. This is a cumbersome and nonefficient method for archiving and retrieving messages.

Many of these SSRPD's have an analog input such as a microphone input for changing messages in the field. But the field may be a noisy environment and would produce less than desirable results compared to a quiet studio type of environment. An audio line input is often provided on currently available units. This is more direct and helps eliminate the noise problems associated with a microphone however, another record/playback device such as a tape recorder is still needed to transfer and archive message information. Furthermore, this process is also very slow in that it happens in real time. Thus, changing a ten minute analog message would take ten minutes to download, and ten minutes of upload time at each SSRPD.

Although many of the currently available devices have simple trigger inputs such as a single contact(s) or switch closure or open-collector transistor level change, they do not have a sophisticated analog and/or digital program input(s) processor and bus architecture for interactive as well as non-interactive control. They also do not have a time and control processor which may perform sophisticated internal timing and control, as well as interface to other devices through an accepted digital interface such as the Musical Instrument Digital Interface (MIDI) standard, Society of Motion Picture and Television Engineers (SMPTE) interface standard, Small Computer Systems Interface (SCSI), RS-232, networks such as ethernet, neural networks and the like. These external devices with which communications would be performed may include but are not limited to; other SSRPDs, computers, robotics, musical instruments, lighting controllers, appliances and the like. The currently available devices also cannot perform sequencer functions so that several devices may be linked together and synchronized using MIDI, RS-422, SMPTE and the like. This would be useful for example, where several SSRPDs are spread out in an animation and lighting show which might include robots, light controllers, MIDI instruments, and audio/video animatronics.

Conversely, although some of the currently available devices have a simple output signal(s) such as open collector transistor logic, they do not have a sophisticated control output processing module that interfaces via bus architecture with the other elements of the SSRPD, and provides analog and/or digital control of another device(s). Control of a different type of device such as an animation robot, computer, or other SSRPD which is synchronized to the time and control processor would be a desirable capability.

Another problem with currently available message devices and SSRPD's is that inherent within the RPM and related circuitry there may be a significant error signal(s) which is not desirable as a part of the message information. For example, in currently available audio record/playback or playback-only VLSI integrated circuits which are the heart of the SSRPD or POD, there exists a DC offset voltage in the record and/or playback circuitry. These offset voltages are an inherent part of the VLSI fabrication and although they may vary in level from one IC to another, they cause an undesirable effect of a popping noise at the beginning and end of playback. This may not be significant with lower offset IC's and low gain audio systems, but may become very significant when higher offset ICs are used with high gain audio systems. The popping noise is not only annoying but may also in extreme cases damage a speaker or amplifier. Additional circuitry such as analog summing circuitry may be added externally to the VLSI to sum in correction voltages, but this adds to cost and circuit complexity. There is no current means for removing this error without-the addition of correction circuitry.

Most of the playback only devices as well as SSRPD's have a trigger input for triggering message play. There are many possible trigger sources from a simple relay or switch contact closure to a sensor trigger such as a motion sensor. In either case the message device is triggered by a simple level or edge trigger. If the source is a more complicated device such as a motion sensor the output of the motion sensor electronics must be a simple level or edge trigger to interface properly with the message device. A means for adjusting the sensitivity of the threshold for triggering to accommodate various complex and multiple trigger sources and accept different trigger levels for each is not available on current message devices. Therefore, if a different trip level sensitivity is desired it may only be accomplished by changes to the trigger source itself. Furthermore, there is no sophisticated time and control and program input processing on the currently available devices to provide a much more flexible means for synchronization and triggering.

There are many cases where it is desirable to operate an SSRPD on batteries. Furthermore, several applications require portability. Most of the currently available devices may be operated from alternating current (AC) power and many have DC power inputs. These devices however, are generally not designed for low power consumption. There are inexpensive PODs available such as talking watches, that operate from batteries are often in an off or sleep state when they-are not in use to conserve battery life. A simple trigger as previously described may be used to wake them up, playback the message then return to sleep or turn off. With currently available devices however, there is no capability to operate in a low power active sleep mode whereby the SSRPD may actively look for a trigger at predetermined intervals, sample the trigger source and only if it meets a given predetermined trigger criteria, awake, play the message, then revert to the low power state. This is especially useful when interfacing with more sophisticated sensors such as motion sensors.

It is thus apparent that a need exists for a message device and SSRPD which may record and playback information such as message, internal and external control, timing and synchronization, program input, and program output information using resident solid-state memory(s).

It is also apparent that a need exists for a message device and SSRPD with an interface for direct and efficient exchange of message and other information without degradation.

It is also advantageous to use this interface for exchanging the information with other SSRPDs and other devices such as a CID via a portable storage device.

It is further advantageous to be able to use this interface or other separate interfaces for simultaneous control or communication with other devices such as animated robots, computers, other SSRPD's and the like.

It is also apparent that the need exists for a message device and. SSRPD which may master and transfer information without degradation through a PSD or other digital interfaces, and which does not require a special development system or require that a device's resident memory(s) be replaced or reprogrammed by a development system to change message and/or other information.

It is further apparent that the need exists for an intelligent computer interface device that may work with any standard computer or dumb terminal and provide lossless reading, writing, editing, and efficient archiving and retrieving of PSD information without the need of a special development system.

It is further desirable for the CID and computer or dumb terminal to be able to perform diagnostic procedures on the PSD and SSRPD.

It is also apparent that the need exists for a method to remove undesirable error signals from the SSRPD without the need for error correction circuitry. It is further advantageous to make this correction without any adverse effect when information is transferred via PSD or other means from one SSRPD to another.

It is also apparent that the need exists for a message device and SSRPD whereby trigger sensitivity and may be adjusted by the SSRPD rather than the sensor or sensor electronics.

Finally, it is apparent that the need exists for a message device and SSRPD which may operate in a low power active sleep mode that may actively look for a trigger at predetermined intervals, Sample the trigger source and only if it meets a given predetermined trigger criteria, awake, playback the message and other information, then revert to the low power state.

BRIEF DESCRIPTION OF THE INVENTION

This invention relates to an electronic solid-state record/playback device and electronic system, and more particularly an improved, SSRPD and system that may be used to record and playback information such as audio, video, control, and other data. The SSRPD uses no tape or moving parts in the actual record/playback process. The SSRPD has an audio and/or video and/or other data record/playback module (RPM), which performs all of the record signal conversion, recording and data compression algorithms, digital signal processing, and playback signal conversion. The SSRPD has program input processing and control output processing modules so that other devices may be controlled in many different ways including interactive control. A time and control processor module facilitates internal synchronization of the SSRPD audio, video, and control information, as well as synchronization with other devices. The SSRPD audio, video, control, and other information is recorded into an internal resident memory(s).

An interface for an external digital memory device allows information to be exchanged without degradation via a digital PSD such as a RAM card, with other SSRPDs as well as to a CID. Message and control information may be mastered on any SSRPD and transferred to other SSRPDs without the requirement of any other equipment. The CID is an intelligent device that connects to a standard computing device such as a personal computer (PC) or even a dumb terminal, and facilitates functions such as reading, writing, editing, and archiving PSD data, as well as performing PSD and SSRPD diagnostic routines. The CID may also be used in conjunction with computing equipment as a mastering station. The system components and component building blocks may be integrated or modular. The entire system, system components, and component building blocks may be used in such applications as audio/video animatronics, lighting and control systems, amusement park attractions, point-of-sale advertising, multi-media devices, multi-track recording, and robotics.

This invention has many other advantages, and other objectives, which may be more clearly apparent from consideration of the various forms in which it may be embodied. Such forms are shown in the drawings accompanying and forming a part of the present specification. These forms will now be described in detail for the purpose of illustrating the general principles of the invention; but it is understood that such detailed description is not to be taken in a limiting sense.

DETAILED DESCRIPTION OF THE DRAWINGS

DETAILED DESCRIPTION OF THE INVENTION

Figure 1:
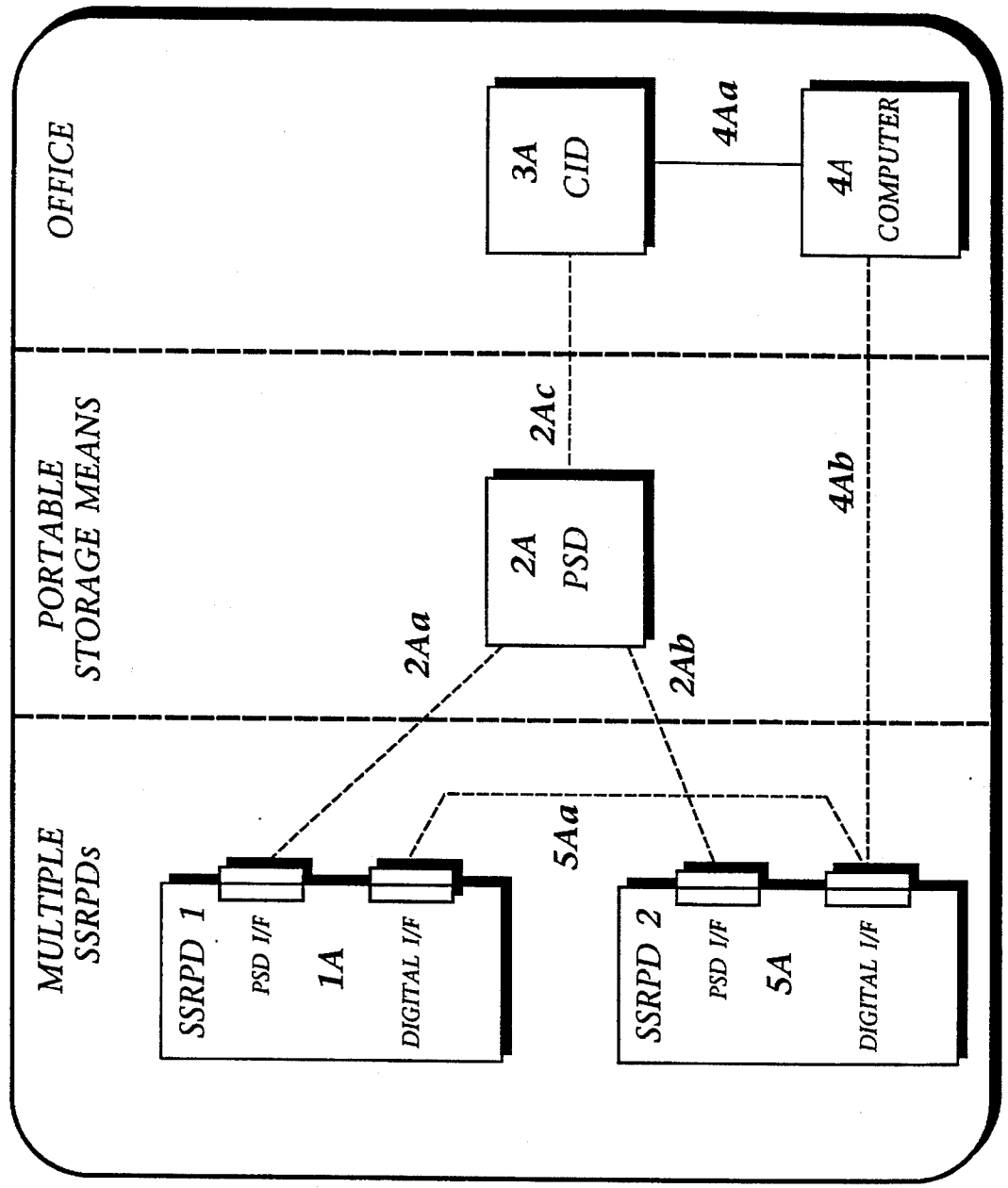
FIG. 1 is a block diagram of the overall system in accordance with this invention.

Referring to FIG. 1, the latter illustrates a preferred form of the entire system illustrated in diagrammatic form for purposes of explanation. The system includes an SSRPD 1A, which may record audio, video, timing, control, and other information. The SSRPD shows two separate digital interfaces which are in addition to several other interfaces not shown in this diagram. Communications with PSD(s) 2A, is indicated by lines 2A*a* and 2A*b,* while other device communication with like digital interfaces such as other SSRPDs 5A, and computer(s) 4A, is indicated by lines 4A*b* and 5A*a*.

In alternate embodiments these two interfaces may be combined. Control, timing, and other information may be exchanged between devices as indicated by lines 4A*b* and 5A*a,* while line 4A*a* interconnects the CID 3A with the computer 4A. Recorded information from any one SSRPD 1A, may be copied to a PSD 2A, and then the PSD may be used to copy to as many other SSRPDs 5A-as desired without the requirement of additional devices. In addition, the PSD may be used in conjunction with a standard computer 4A, via a CID 3A. The PSD communicates with the CID as indicated by line 2A*c,* and may perform two way transfer of data with the computer or dumb terminal.

The CID is intelligent device which has its own built in command and control set programmed into it. The CID may receive standard characters from any terminal, and it recognizes and interprets them. It may also send standard characters to the terminal. The CID has its own buffer memory to allow the reading, writing, and editing of PSD data, as well as perform diagnostic routines and a limited amount of archiving. With the aid of a computer, files may be archived and retrieved in a manner limited only by the computer's mass storage and filing capabilities.

Figure 2:
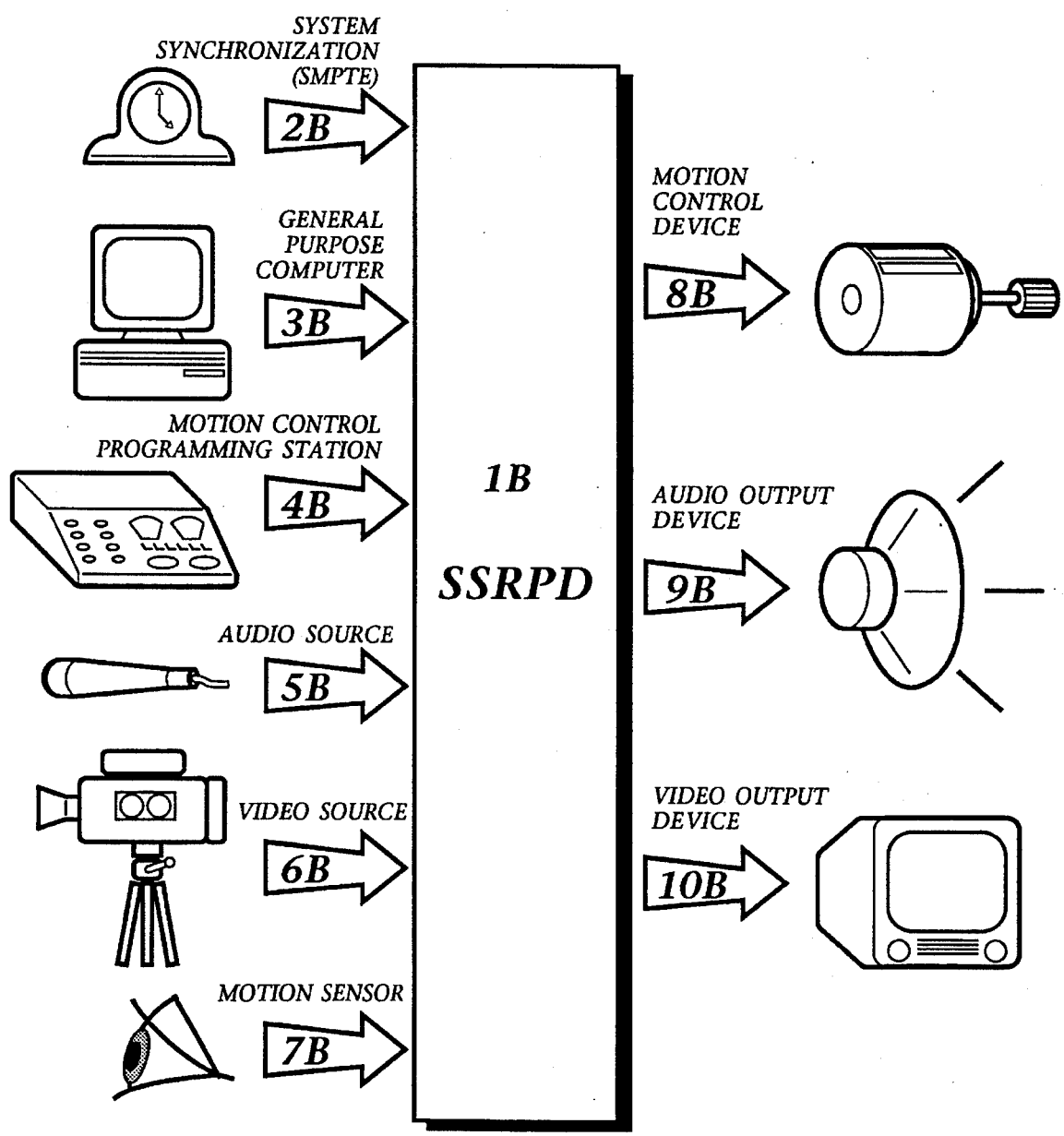
FIG. 2 is a simplified pictorial diagram of typical SSRPD input and output functions in accordance with this invention.

Referring now to FIG. 2, a 'simplified pictorial diagram of typical SSRPD input and output functions is shown. The SSRPD 1B, receives message information such as from audio sources 5B, video sources 6B, and the like. Audio sources may include but are not limited to microphone, audio line level signals, and the like. Video sources may include but are not limited to video cameras, video line level signals such as VCRs, video disks and the like. These sources may be analog or digital and are not limited to audio and video signals.

Another input(s) for programming control functions 4B, for such purposes as animation or robotic motion control is provided. These inputs may be analog, digital, or a combination of both. They could also be used for interactive control or be alternate data or trigger inputs such as a heart monitor, temperature sensor, humidity sensor, pressure sensor, or a motion sensor 7B, etc. The program inputs may be used in conjunction with the control outputs 8B to provide a complete real-time control system. A general purpose computer input 3B, is provided for controlling the SSRPD by computer or other devices with similar interfaces. For example, a computer may be used to control several SSRPDs in various locations as well as lighting controllers, water fountains, and the like. Separate addressing of each component, provides individual command and control through a common interface or network. A system synchronization input and thruput is provided wherein a timing system such as SMPTE or MIDI 2B may be used to interconnect, synchronize, sequence and control other devices such as video equipment, MIDI instruments, sequencers, and the like.

Referring again to FIG. 2, an output interface 8B, is provided for motion and other types of output control of devices such as a motors, solenoids, piezoelectric transducers, and the like. This provides the capability to perform simultaneous motion and other control along with message information. The control outputs could be analog, digital, or a combination of both. In this way control of animatronics, robots, and the like may be achieved With the SSRPD.

An audio output 9B, is also provided. This output represents one or more audio outputs which may be in various forms such as audio line level, speaker level, or speaker output. Furthermore, this output is not limited to audio signals and could be analog, digital, or a combination of both. A video output 10B, is also provided. This output represents one or more video outputs which may be in various forms such as video line level, RGB, VGA, and the like. Furthermore, this output is not limited to video'signals and could be analog, digital, or a combination of both.

The SSRPD design is based on functional modules connected to address and data busses. In preferred forms of the invention, the module functions may be simplified and/or combined, and the busses may be combined or substituted by direct connections. Referring now to FIG. 3, the SSRPD is illustrated in block diagram form. The heart of the circuitry involves a RPM 18C, RPM controller 12C, and RPM memory 15C. The RPM performs all of the record signal conversion such as analog to digital (A/D), recording and data compression algorithms, digital signal processing, and playback signal conversion such as digital to analog (D/A). RPM 18C, receives inputs for recording from sources such as microphones 30C through the microphone input 25C, line input sources 31C such as tape recorders, compact disk (CD) devices, video disks, VCRs, video cameras, audio mixers, and the like through the input 26C.

During playback the RPM's audio/video or similar output is provided via a buffered line amplifier 34C to line out interface 22C, and to external audio/video and other devices 28C with a compatible input such as audio/video monitors. The line out interface may also include a telephone interface 35C and input/output means 36C, which may facilitate telephone 17C line message capability such as messages on hold. Power amplifier 23C is provided for directly driving a speaker 29C through speaker interface 24C.

Although an RPM may have its own control capability, a much greater degree of flexibility is attained using a separate RPM controller 12C. The RPM controller is the main brain of the SSRPD and controls the RPM and other modules through the RPM address and data bus 19C. All of the commands to record, playback, set sampling rates, initialize, and the like are issued by controller to the RPM on this bus. The RPM memory 15C, PSD interface (external memory and alternate digital interface) 27C, one port of the time and control dual port memory 13C, and input/output interface 11C, are also attached to the RPM bus. The RPM also has a digital interface 21C, which enable direct digital communications to a digital device 20C, such as a computer.

All of the recorded audio/video and other message information is recorded into the resident memory via the RPM controller. The dual port memory 13C, facilitates the interplay between the time and control process and the and the RPM process. Because the memory maps of the time and control subsystem 43C, and the RPM subsystem are shared, countless interactive scenarios are possible. For example, the time and control events could determine the message playback events. Conversely, message events could determine timing and control events. Interactive events could also occur based on a combination of timing and control events as well as message events. Information may be held indefinitely by either resident memory 15C or 18C, by the use of non-volatile memory devices such as flash EEPROM or static RAM (SRAM) with a back-up battery or super capacitor. Because of the dual port memory and RPM bus architecture, the RPM as well as dual port memory contents may be Copied to or from a PSD 33C through interface 27C. This may also be exchanged through other digital interfaces on the SSRPD.

The input/output interface 11C, handles all of the input and output control including the external trigger inputs 5, motion sensor inputs 6C, keyboard 10C input, and display 16C. The external trigger inputs 5C, provide an interface for external devices 1C, which may trigger playback using such devices as a relay or switch closure, shorting plug, infrared beam, open collector or drain transistors, timers, alarm circuits, and the like. The motion sensor inputs 6C, may also trigger playback when used with motion sensors 2C, such as pyro-electric or ultrasonic devices.

The SSRPD also has the ability to read a trigger and adjust the trigger criteria at the SSRPD. The trigger inputs may be sampled for parameters such as frequency, on time, off time, and amplitude. Based on these and other parameters the time and control processor 43C, or the RPM controller 12C may compare them to user defined criteria to determine the trigger point. Moreover, different criteria may be applied to different conditions. For example, an SSRPD triggered by a motion sensor could be setup to sample the motion sensor at different time intervals. The early intervals might be setup for a more sensitive trigger point and the later intervals setup for a lesser trip point.

A keyboard 10C, is provided for manual user control and system configuration. The user may control record/playback functions directly with the keyboard and also set up control parameters which include but are not limited to playback delay times, trigger source, low-power sleep times, message order, and more. Interrupt control circuitry 9C, is used in conjunction with the trigger inputs and keyboard to provide wake-up from sleep and other interrupt possibilities.

The time and control bus 48C, provides a very flexible means for receiving program and alternate data inputs, alternate trigger inputs, internal and external time synchronization, system level control, and-a means for controlling output devices. The time and control processor 43C, manages this bus. Digital interface 46C, facilitates communication with other devices with the same type of digital interface 47C, such as computers using SCSI, RS-232, and networks such as ethernet, neural networks and the like. This interface may provide for system level control or be controlled by an equivalent master system. Through this or one of the other digital interfaces, RPM and other information may also be directly exchanged between SSRPDs and other devices. This provides another method of data transfer in addition to the PSD.

The time and control processor also provides the means for external as well as internal synchronization. A timing reference device(s) 45C, may be used to provide a synchronization clock whereby one or more units may be synchronized together using a common format. The MIDI, SMPTE, and RS-422 interface standards are examples. Interface 44C, provides input, output, and thruput as needed to link devices together.

The SSRPD also has the ability to learn control commands through program inputs during a record process and play them back during the playback process for the purpose of controlling another device. The inputs may be analog, digital, or a combination of both. Control information may be synchronized to message and other information. This is very useful for example, for audio animatronics. Message information may be recorded at the same or different time from the control information. Conversely program instructions may be taught to the SSRPD at the same or different time from the message information. In this way either program or message information may be edited until you are satisfied with the final result. These same inputs may also serve as alternate data inputs for recording, triggering, or interactive control inputs. They may also form the feedback portion of a control system, or provide limit or alarm processing for intelligent control. The program input device(s) 39C, could be as simple as a bank of switches to as intricate as complex analog sensors and signals. The program input processing circuitry 37C, receives inputs via interface 38C, and may convert analog signals to digital form and/or process digital signals into proper format for the time and control bus. During playback, the time and control processor puts the control data out on the bus to the control output processing circuitry 40C. This circuitry may contain analog and/or digital conversion circuitry, or whatever circuitry is necessary to drive the load(s). This circuitry through output interface 41C, controls the devices under control 42C. These devices for example could be motors, solenoids, piezoelectric actuators, and the like.

The SSRPD may be AC line 32C powered, by typical AC adaptors 3C, or DC powered through interface 7C, or via batteries 4C, through interface 8C. Power distribution and control circuitry 14C, is used to condition input power, switch between power sources, prevent problems if power is removed in an untimely manner, and preserve low power operation to extend battery life. The interrupt circuitry 9C, may be used in conjunction with the power control and distribution. One example of this is that the SSRPD may be set up to operate in a low power active sleep mode that may actively look for a trigger at predetermined intervals, sample the trigger source, and only if it meets a given predetermined trigger criteria, awake, playback the message and other information, then revert to the low power state.

The SSRPD also has the ability to perform RPM error correction to the message information without the need for additional correction circuitry. There are many possible error sources that may result from RPM imperfections as well as other sources. They could result in unwanted video and/or audio information.

Figures 1, 10:
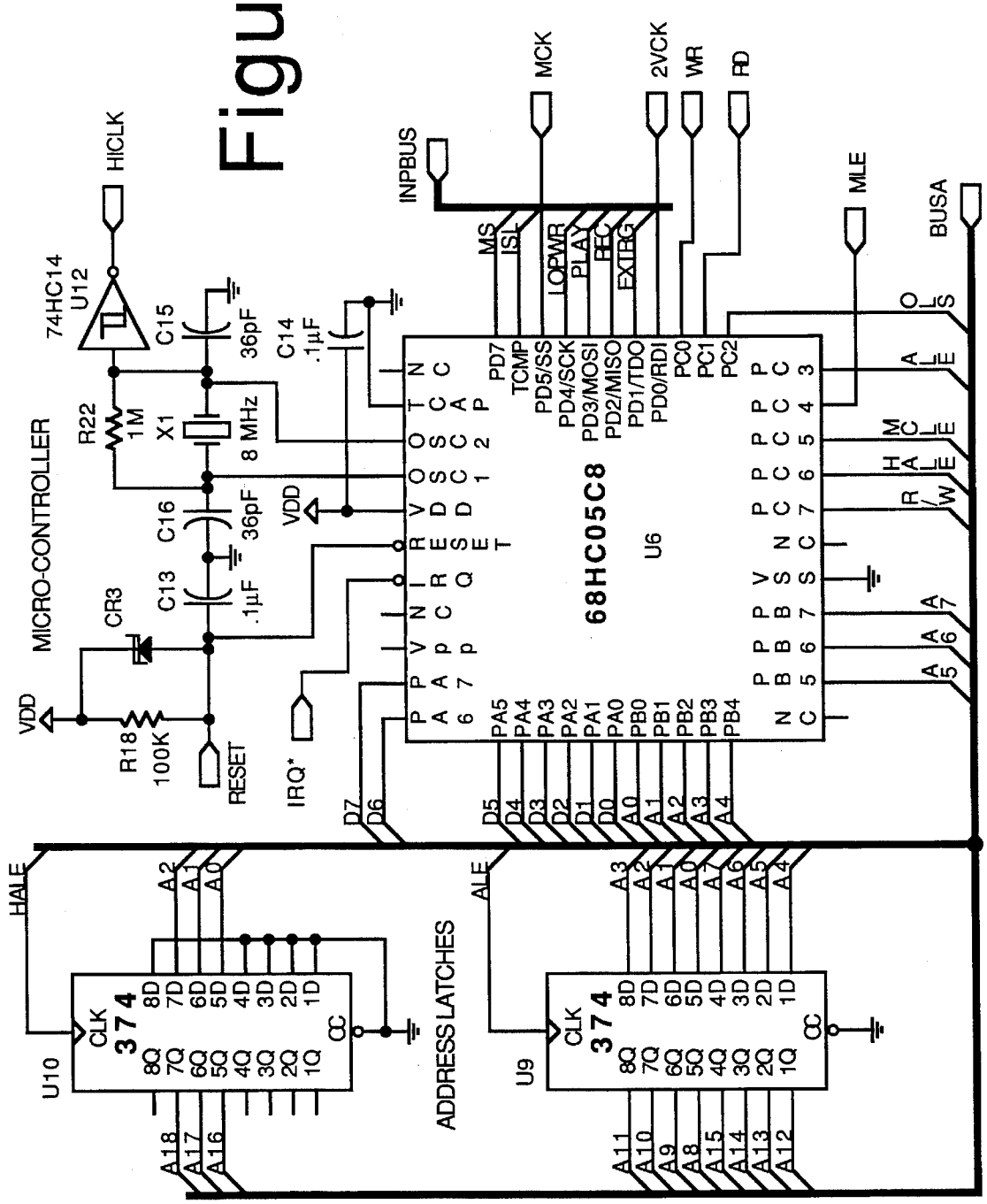
FIG. 10 is a schematic diagram of the remaining portion the SSRPD schematic of FIG. 9 showing the RPM, RPM bus, controller, resident memory, display, PSD interface, audio line and power amplifiers, audio input, and other circuitry.
Figures 2, 10:
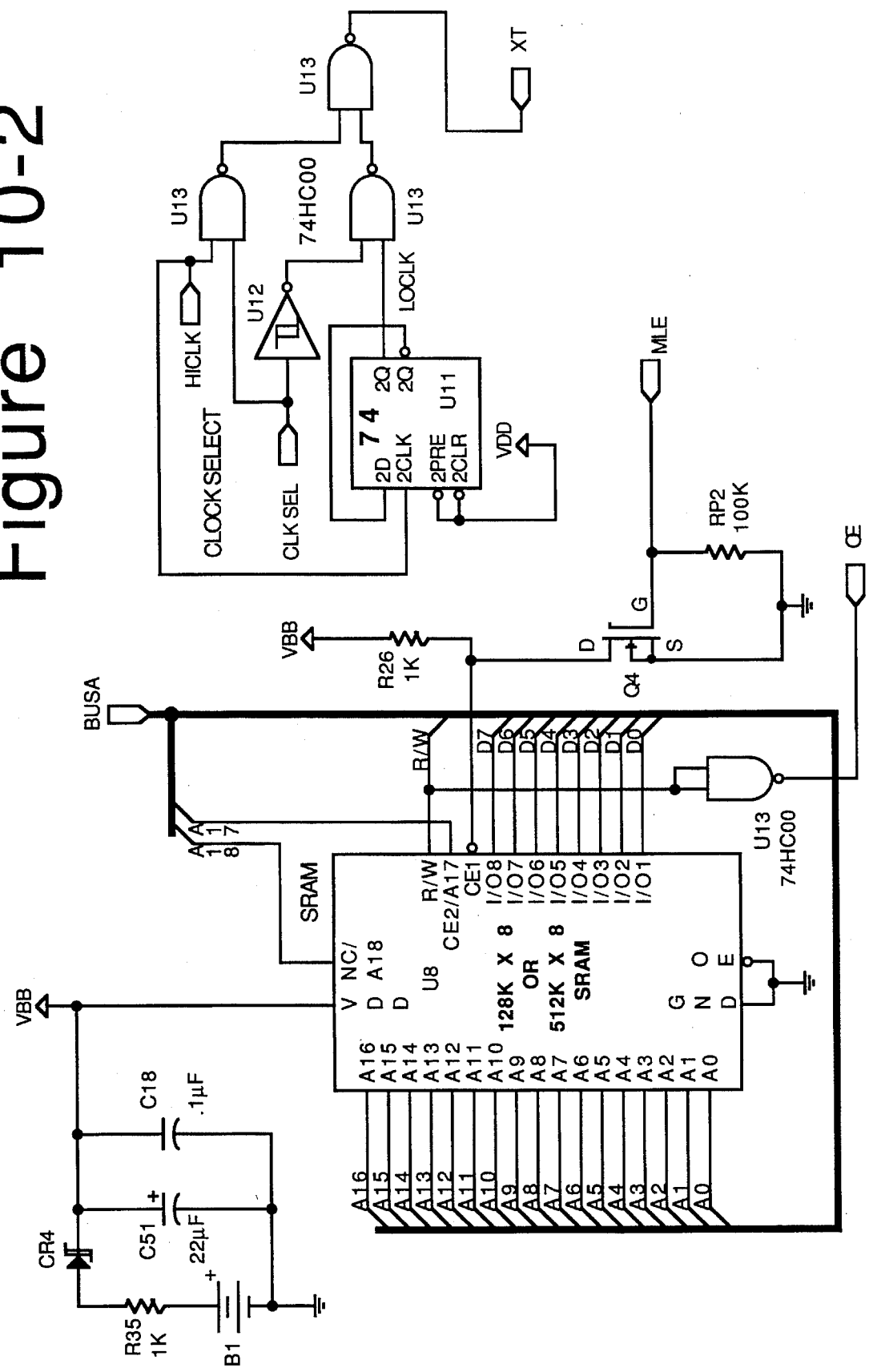
Figures 3, 10:
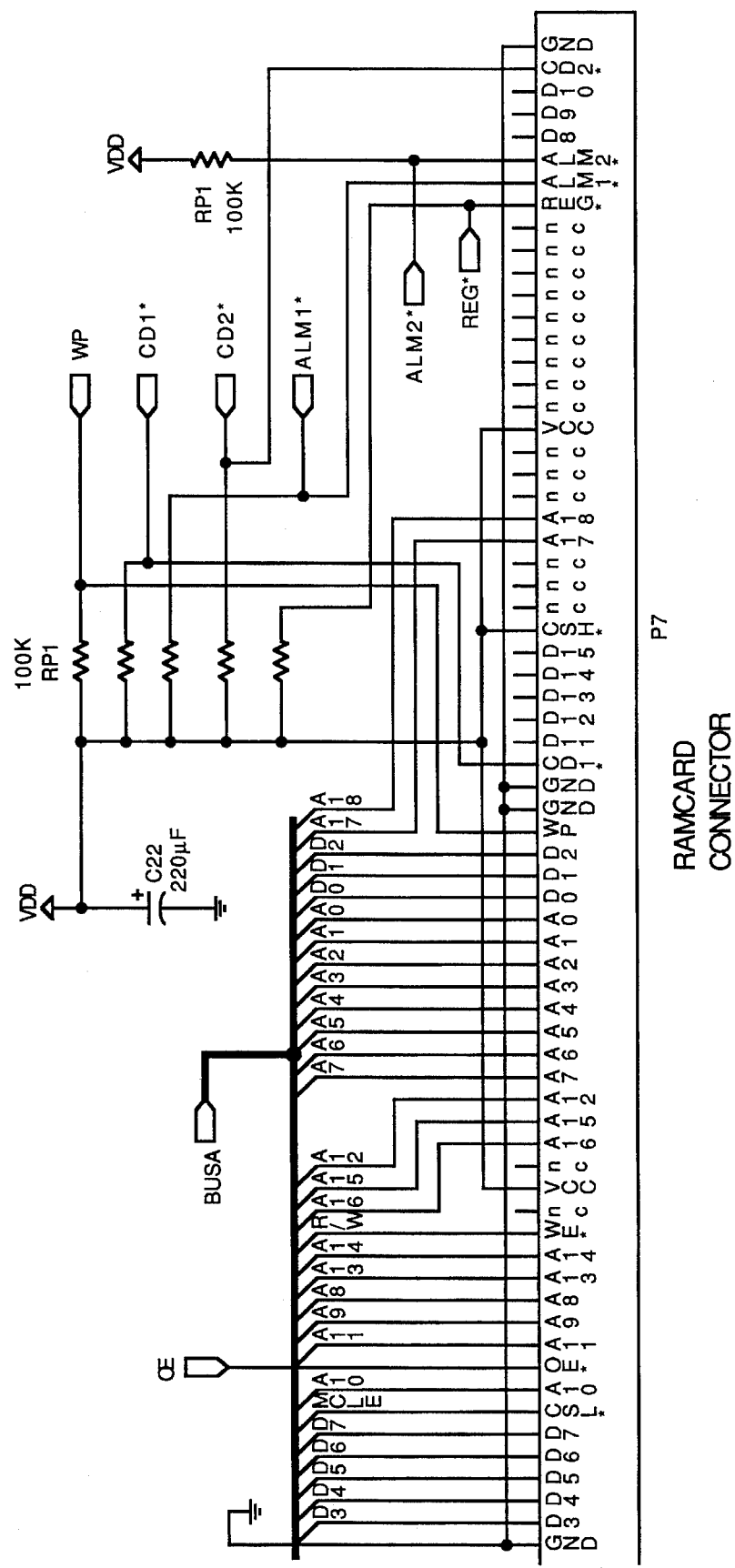
Figures 4, 10:
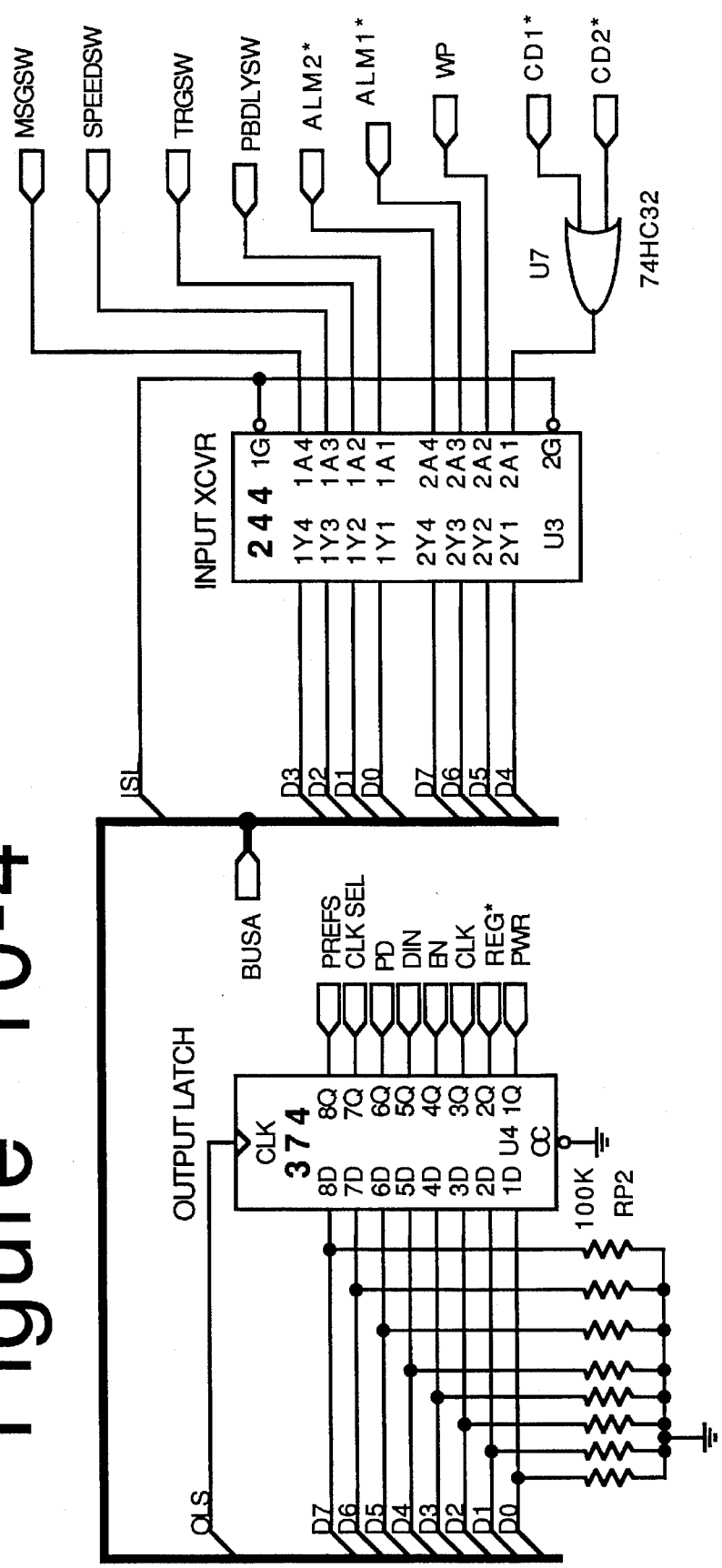
Figures 5, 10:
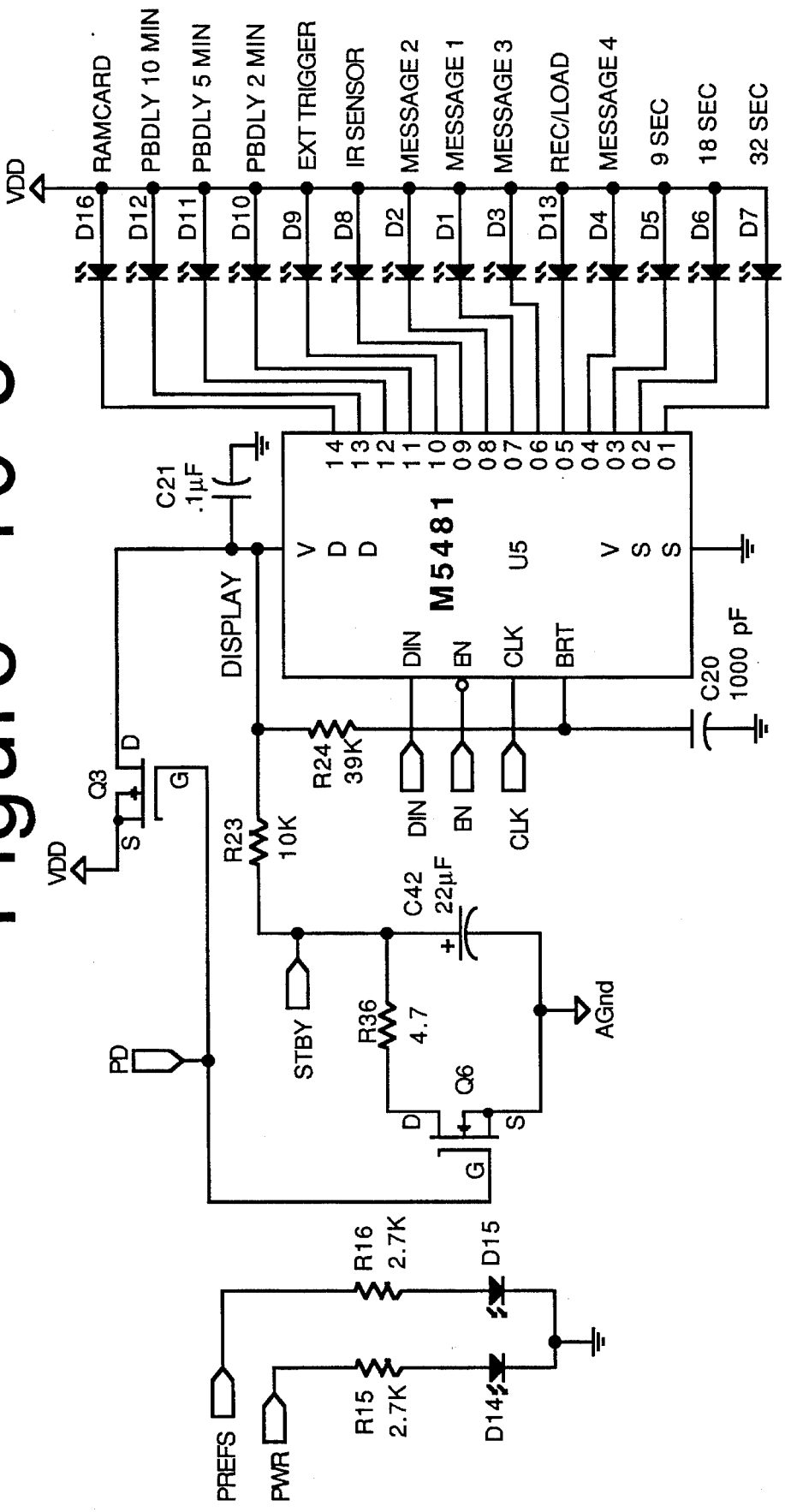
Figures 6, 10:
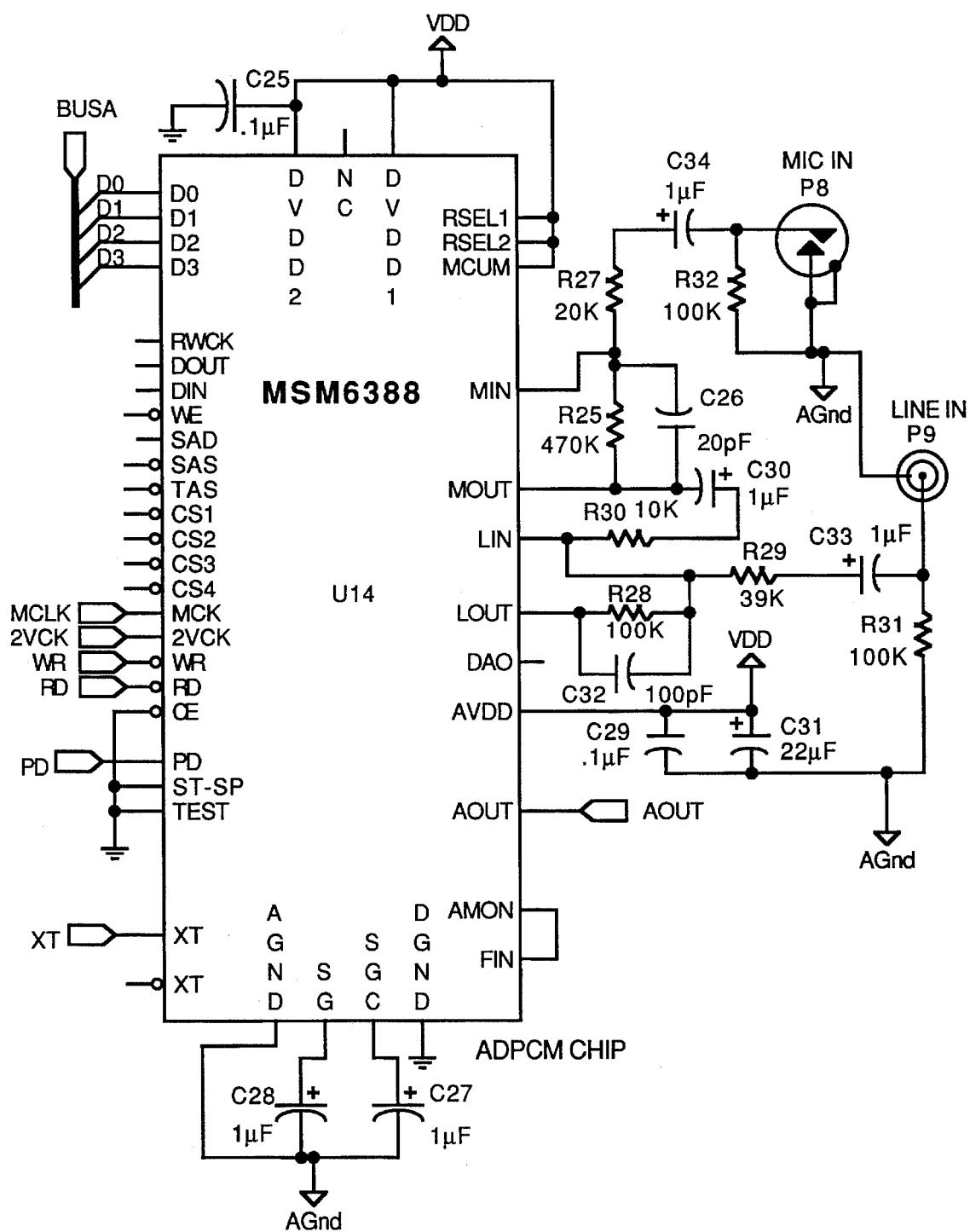
Figures 7, 10:
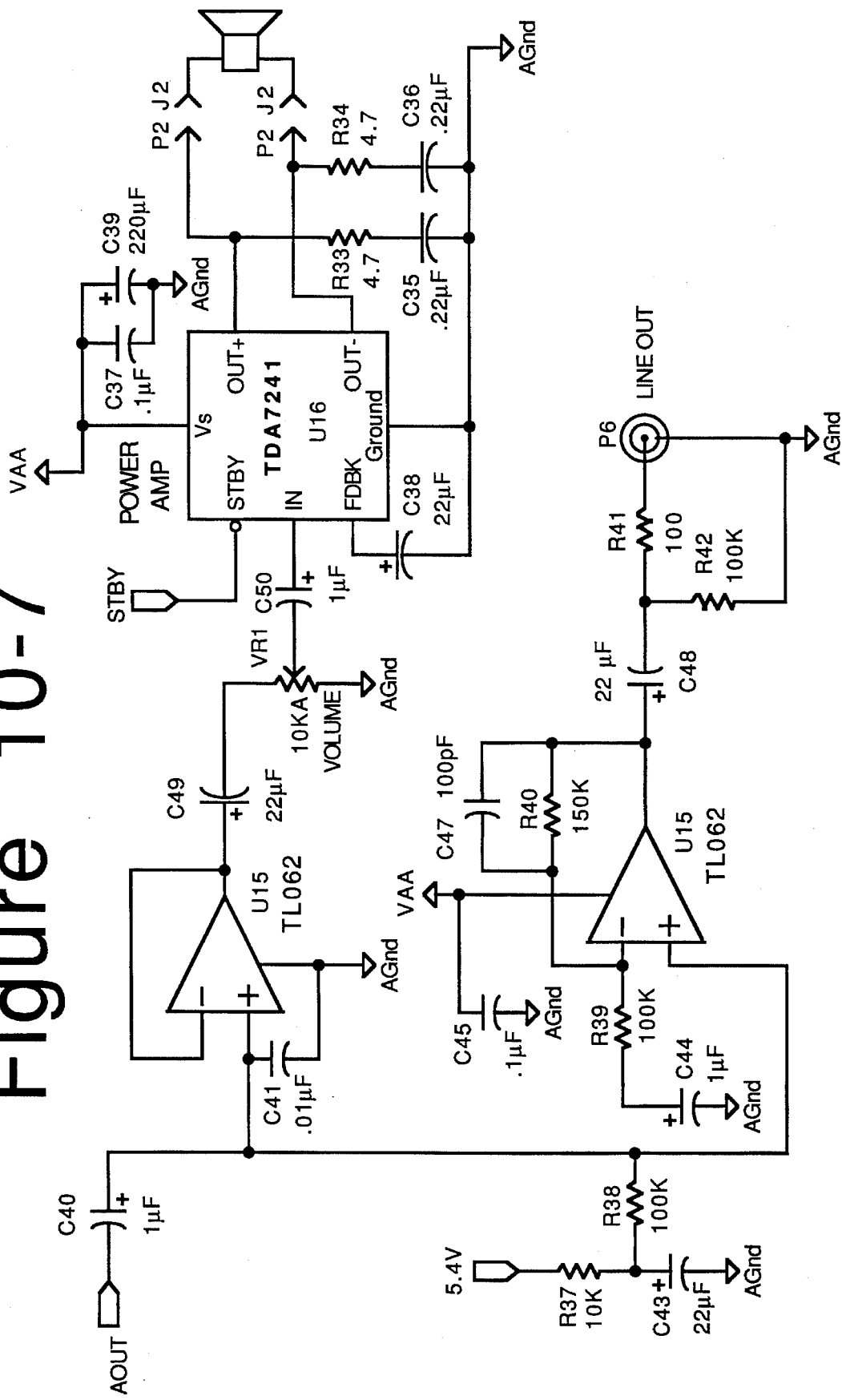
Figure 11:
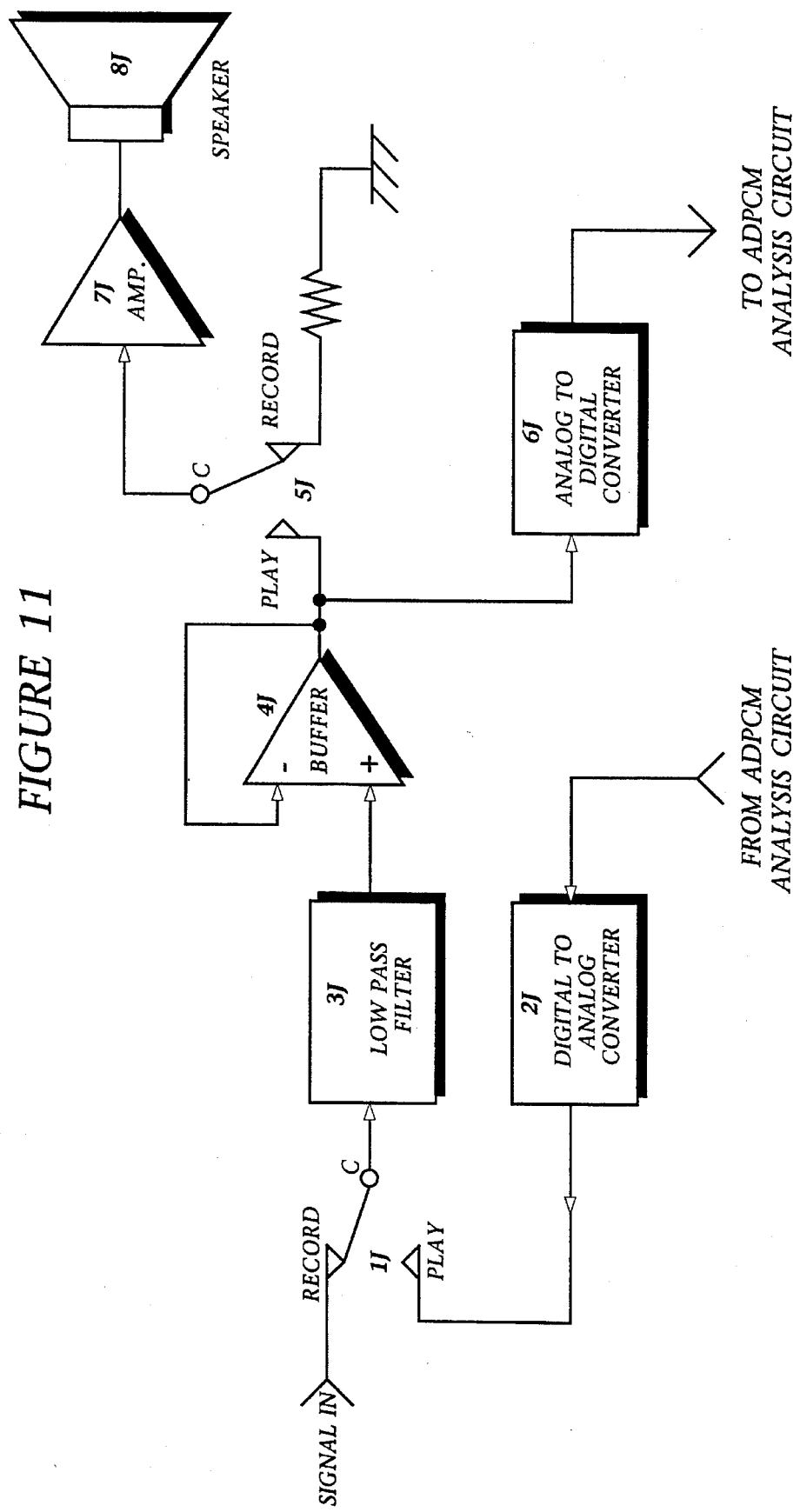
FIG. 11 is a simplified schematic of a typical solid-state record/playback VLSI A/D circuit for the purpose of DC offset analysis in accordance with this invention.

To better illustrate this, consider the schematic FIG. 10, of a portion of the preferred embodiment. U14 is an audio RPM VLSI. Within the RPM VLSI there exist DC offset voltages inherent to the record circuitry and playback circuitry. FIG. 11 shows an example of a typical internal simplified schematic diagram for one such portion of a this particular ADPCM VLSI. Inside the chip the offset inherent in the analog switch 1J, low pass filter (LPF) 3J, buffer amplifier 4J, analog switch 5J, and A/D converter 6J, circuits are summed along with the analog signal during the record process. The inherent DC offset voltage in the D/A converter 2J, analog switch 1J, low pass filter (LPF) 3J, buffer amplifier 4J, and analog switch 5J, circuits are summed along with the playback analog signal which also contains the previously offset from the record procedure. 7J is a power amplifier which drives the speaker 8J. These offset voltages are an inherent part of the VLSI fabrication and although they may vary in level from one IC to another, they cause an undesirable effect of a popping noise at the beginning and end of playback. This may not be significant with lower offset ICs and low gain audio systems, but may become very significant when higher offset ICs are used with high gain audio systems. The popping noise is not only annoying but may also in extreme cases damage a speaker or amplifier.

Additional circuitry such as analog summing circuitry may be added externally to the VLSI to sum in correction voltages, but this adds to cost and circuit complexity. The improved SSRPD of this invention has the ability remove DC offset voltages without any offset correction hardware. This is accomplished by first characterizing the offset value for each record/playback VLSI and thus the offset characteristic for each SSRPD. There may be effectively different offset values at different sampling rates but the correction method may be used for as many different offset conditions as needed. The correction philosophy is basically the same for different VLSI's, but the details depend on the VLSI's analog to digital A/D and digital to analog D/A conversion scheme.

Two very common methods used by state-of-the-art VLSI's are pulse code modulation (PCM) and adaptive delta pulse code modulation (ADPCM). Since the preferred embodiment describes a VLSI which uses ADPCM, this correction method will be discussed first. Playback and record correction values are determined through device characterization. The playback correction byte(s) are then stored in memory e.g., PROM or RAM. During the record process the record correction bytes are saved into memory as the first few bytes before the actual message data. Often because of the record/playback VLSI characteristics, these values may be equal to each other. During playback the RPM controller grabs the playback correction data bytes first and plays them back followed by the record correction bytes and then the message data. Because these bytes are so few compared to the audio data and their duration in time is typically less than a millisecond, there is no noticeable change to the audio information. Another major advantage of this approach is that when information is exchanged between SSRPDs as in the case of using the PSD, the record correction is automatically self-correcting. This is because the record offset produced in the mastering machine and its correction go with the PSD and cancel each other. The subsequent SSRPDs that receive the PSD information all have their own playback correction and therefore will be able to playback messages from other SSRPDs without audio popping. This method of correction therefore not only corrects for offsets in a single SSRPD, but also automatically provides proper correction even when information between units is exchanged. The philosophy for the case of PCM VLSI's and systems is similar except that the offset values would be carried throughout the audio information memory rather than just in a few bytes.

A digital portable storage device (PSD) such as a Random Access Memory card (RAM card), EEPROM card such as a Flash EEPROM card, fixed and flexible disks, digital tape machines and the like, may be interfaced to the SSRPD and information may be digitally transferred from or into the SSRPD in a manner that is more reliable and generally faster than copying via analog means. Furthermore, this transfer is lossless with no degradation of audio, video, and other information. Message and control information may be mastered on one SSRPD, copied to a PSD, and then the PSD contents may be copied an unlimited number of times to as many other SSRPD's as desired. No other devices, not even the CID is required to perform this function. This unique capability allows any SSRPD to serve as a mastering unit as well as a message and control device. An example which demonstrates the advantage of this feature, is a chain of fifty retail stores that has daily promotions and an SSRPD in each to provide an annunciation of the promotion. One SSRPD may be used at one location to master the message and control information, and then copy its contents to a PSD.

The same mastering unit may be used as the message device in that particular store. The PSD may then be used by a route or delivery person who may already have reason to make other deliveries at the other forty nine locations, and the data may be copied without-degradation, and even in noisy environments, to the other forty nine SSRPD's.

Another example is an audio/video animated robot. The robot commands, audio, video, and even interactive response information may be mastered at one location, then copied using a PSD to several other robots located separately.

Figures 1, 9:
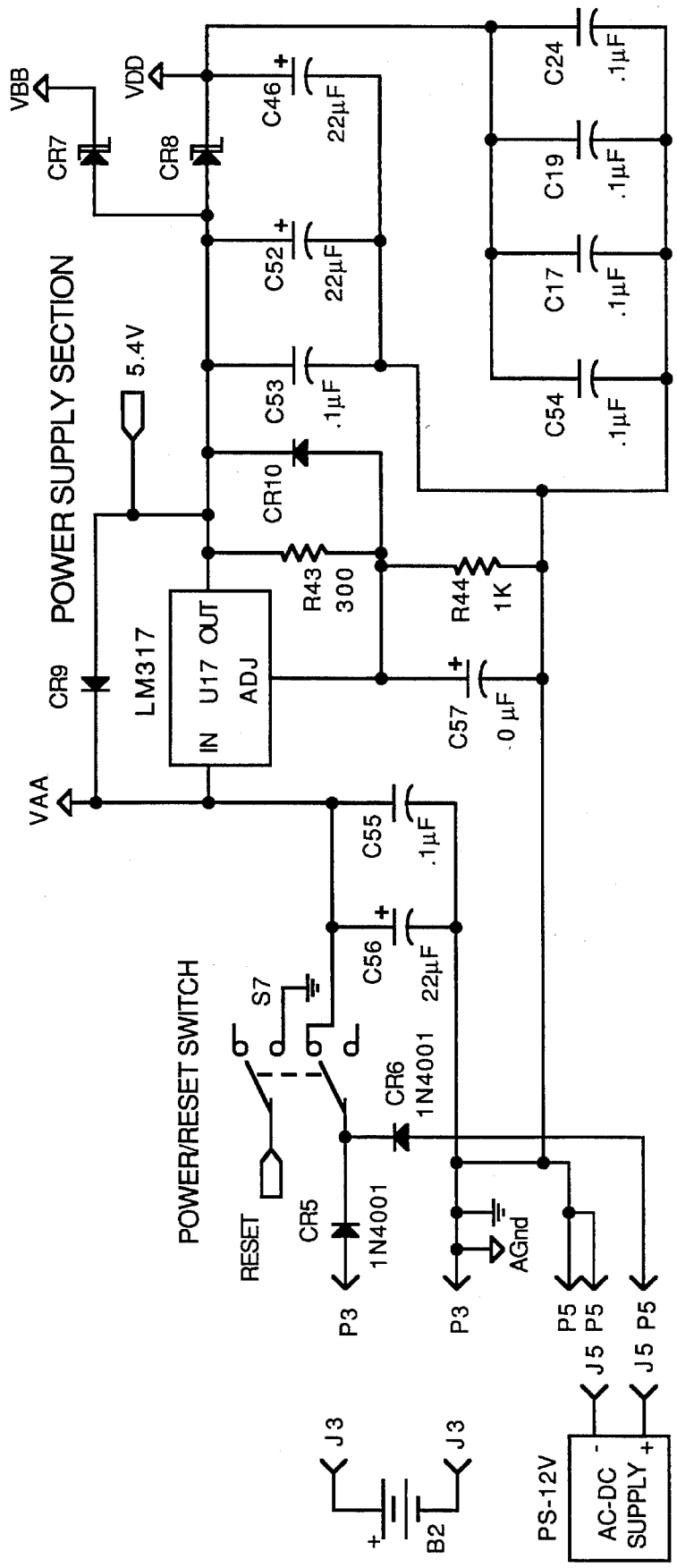
FIG. 9 is schematic diagram of a portion of the of a preferred embodiment of the SSRPD showing the power supply, motion sensor, keyboard, and interrupt logic circuitry.
Figures 2, 9:
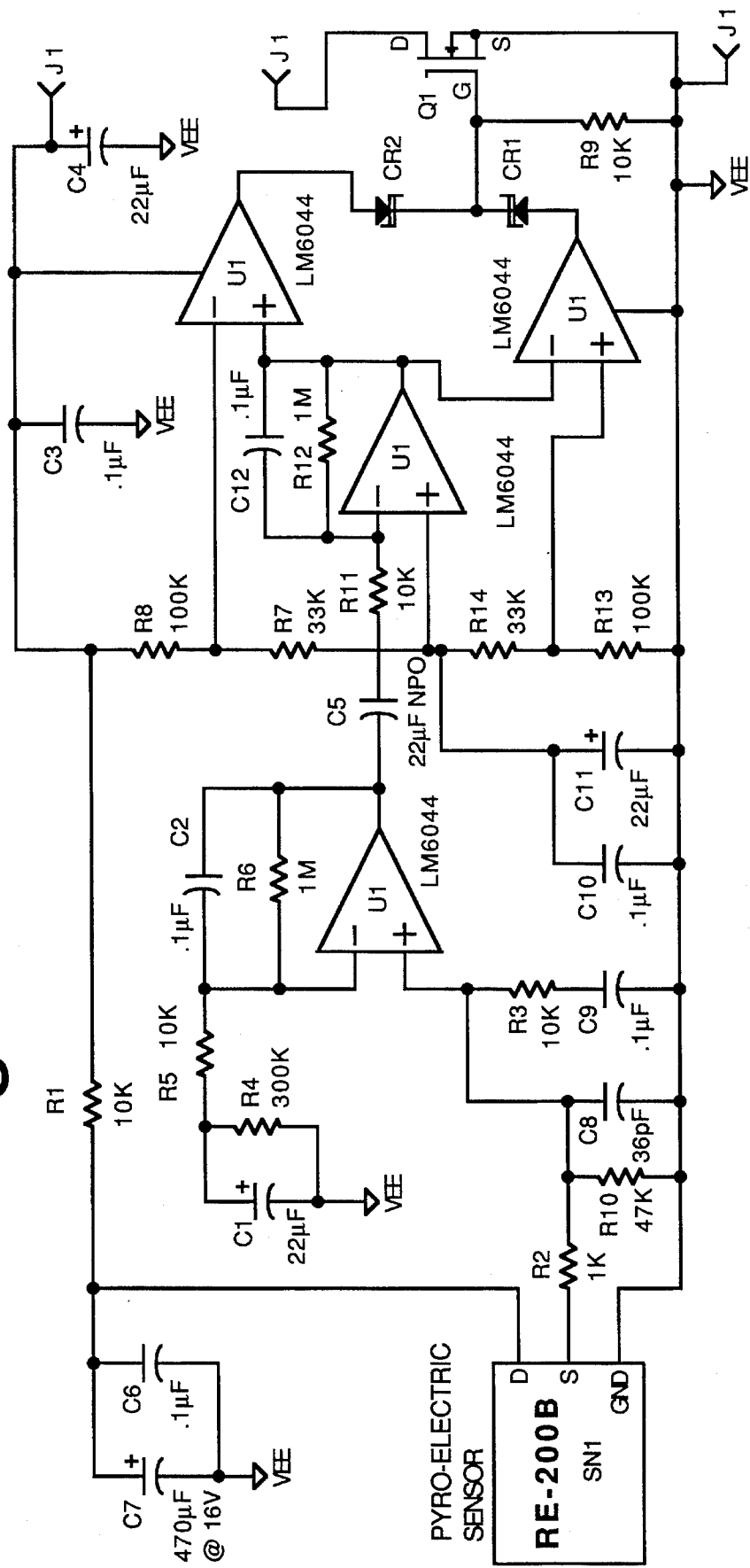
Figures 3, 9:
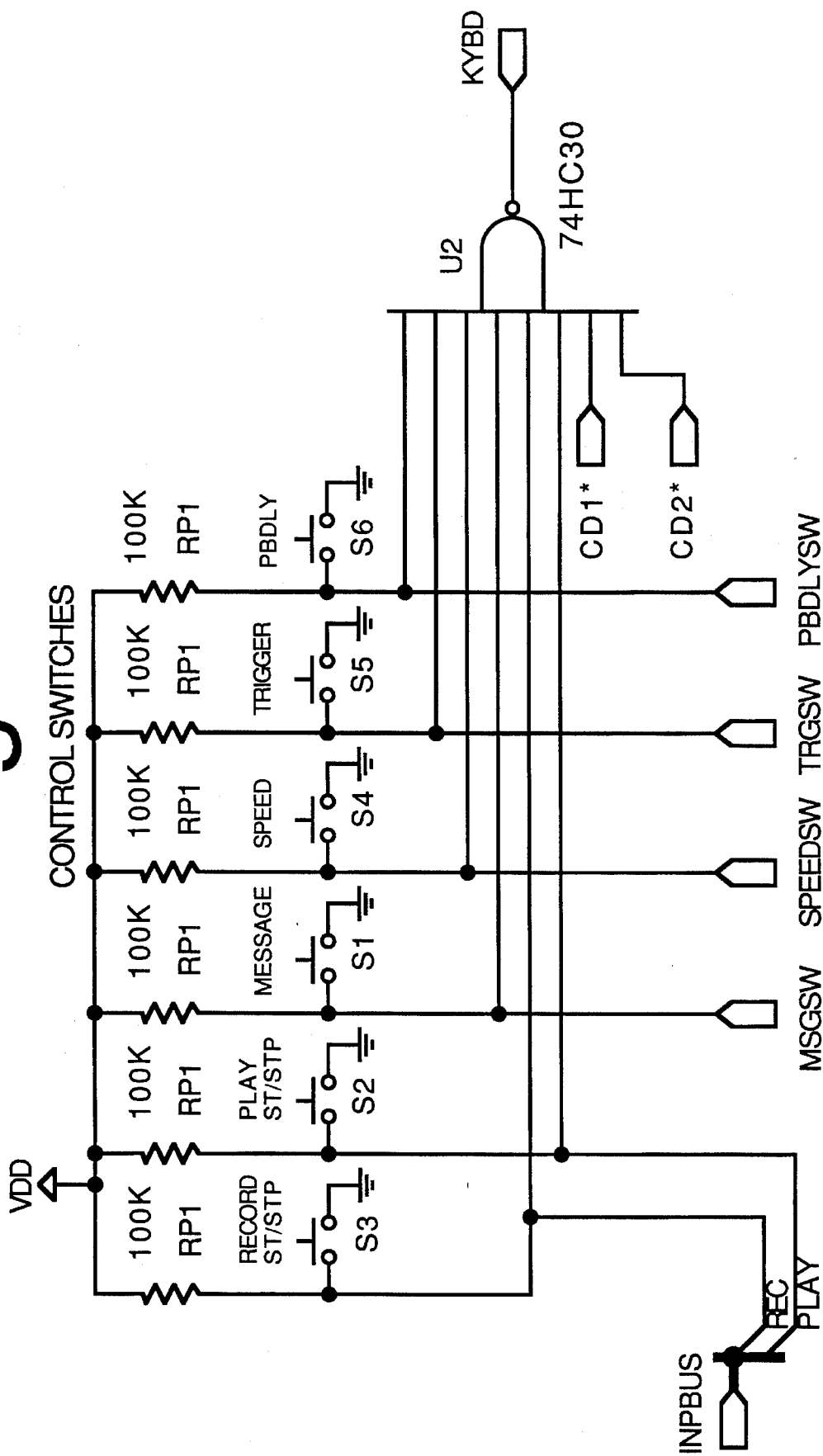
FIG. 3 is a block diagram of the SSRPD in accordance with this invention.
Figures 4, 9:
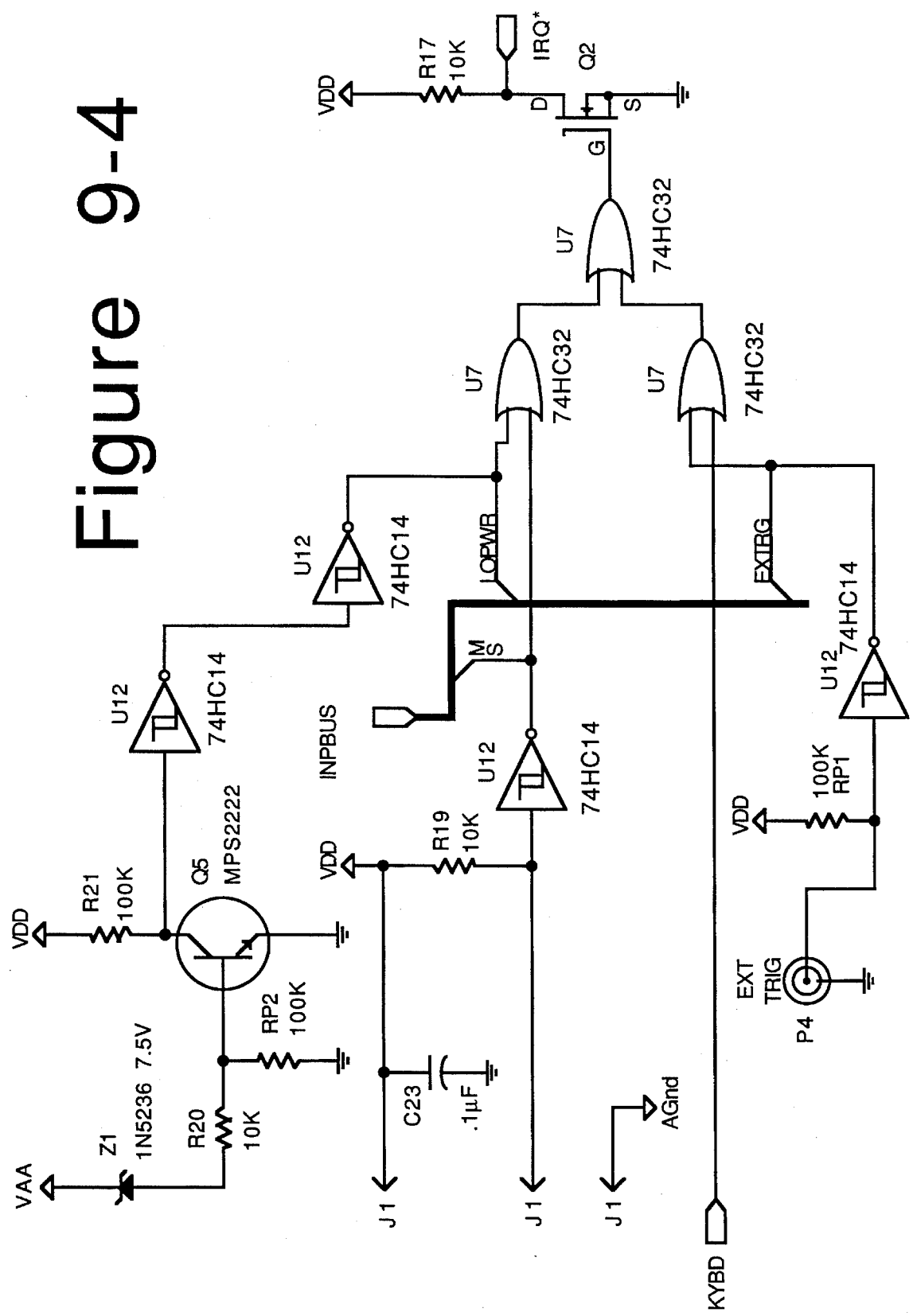
FIG. 4 is a block diagram of the computer interface device in accordance with this invention.

Referring now to FIG. 4, the computer interface device is described in block diagram form. The CID is an intelligent device that has an operating program, which may send and receive standard characters such as the ASCII character set, and may interpret and perform functions based on a command set understood by a CID controller device 1D, such as a micro-controller. The controller device contains at least a microprocessor, RAM, ROM, and I/O. The commands that the controller understands include but are not limited to; reading PSD data, writing PSD data, testing the PSD, editing segments of the PSD data, and archiving PSD information. The address, data, and control bus and interface 9D, provides the communication means for the PSD 10D. This bus also controls a buffer memory 2D, whereby data manipulation and storage may take place. In addition, this bus may be used as an alternate digital interface to other devices including other SSRPDs. This facilitates the ability to perform diagnostic and control procedures directly on an SSRPD using a CID and a computer or dumb terminal. The controller device also corresponds with I/O interface adapter 6D, which communicates through a digital interface 7D, to another device 8D, with the same interface such as RS-232, SCSI, MIDI, and the like. These devices include but are not limited to computers, dumb terminals, MIDI sequencers, and the like. The I/O interface adapter and the controller also send status signals to the display drivers 4D, which in turn drives a display device(s) 5D. An interrupt means 3D, such as a switch is provided to interrupt the controller operation in process, and vectors to a known position without clearing variables. Reset is automatically performed during a power up. The reset clears variables, performs initialization, and vectors to the starting position. The CID is shown in FIG. 4 as being powered from an AC source 14D, through an AC/DC converter 13D, via interface 12D. Power control and distribution circuitry 11D, may be designed to include a variety of power options which include but are not limited to battery operation, or deriving power from one of the digital interfaces 7D or 9D.

Because the CID is an intelligent device which has its own command set, standard characters may be sent and received via digital interface 7D, from any dumb terminal or computer. This eliminates the need for special software which is written for a specific computer. If a computer is desired, virtually any computer such as an Apple, IBM, or compatible may be used. Using a computer with mass storage provides the added ability for a greater degree of storage and archiving. In this way libraries of message and control data may-be created, edited, and saved. An example which demonstrates the advantage of this feature is an amusement park which has SSRPDs located throughout the park and desires to have special messages and control information for various holidays such as Christmas, Easter, and the Fourth of July. A central computer may be used to store the holiday message and the control files when the special event file is required, it may be retrieved from the computer using the CID, and may then be stored to a single or multiple PSDs. The CID and computer may also be used to master information and load directly or via PSDs to SSRPDs.

A preferred form of an SSRPD will be discussed here. This embodiment omits video, and merges time and control subsystem with the RPM subsystem. In this embodiment, an audio and control message device is described.

Figure 5:
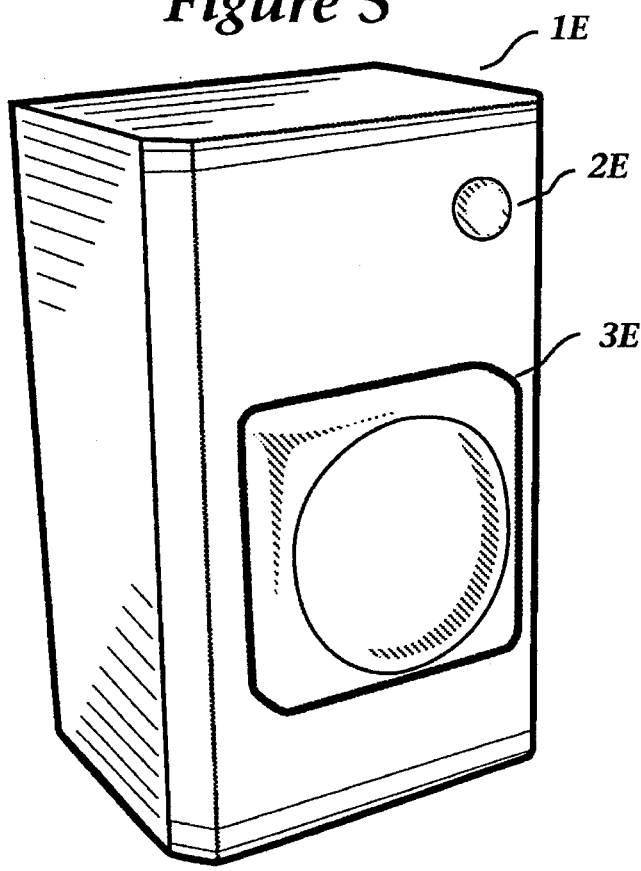
FIG. 5 is a perspective view as seen from the front of the preferred SSRPD unit in accordance with this invention.

Referring to FIG. 5, a mechanical drawing of the preferred SSRPD enclosure is shown. The overall enclosure 1E, is rectangular shaped with beveled sides. The enclosure has a rear hinged access door for access to the control panel and other electronics. An integrated motion sensor 2E, is provided for sensing human or other motion, and serves as one of the trigger inputs. A speaker 3E, is also housed by the enclosure as one of the audio outputs. The SSRPD may be secured by mounting the base or rear door to a fixed surface, or may be used as a portable or free standing SSRPD.

Figure 6:
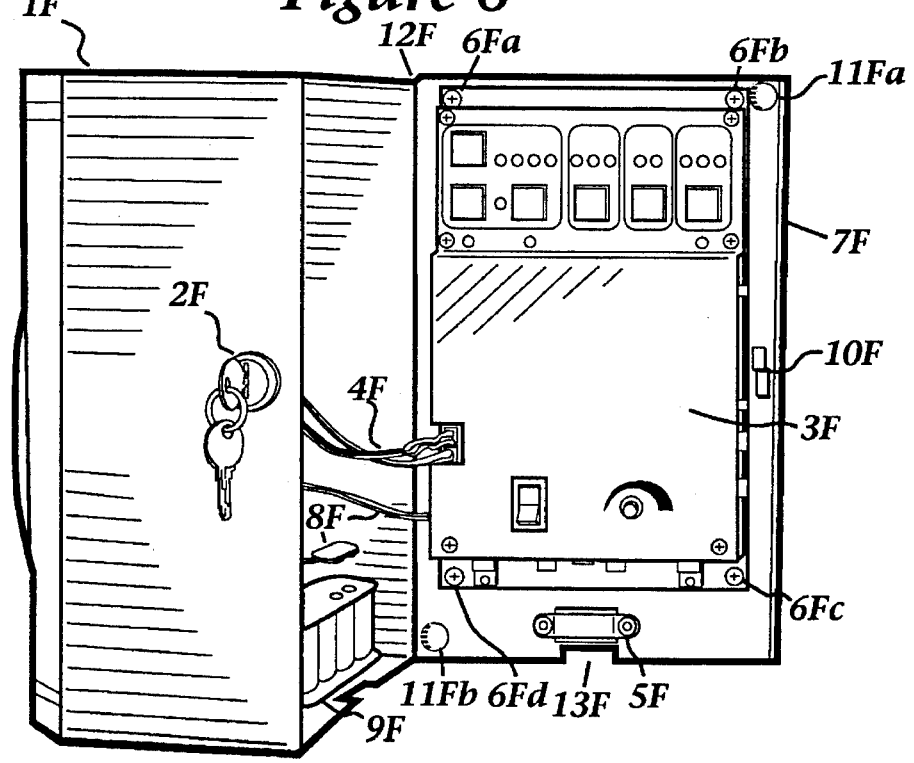
FIG. 6 is a view in perspective of the preferred SSRPD unit with access door open exposing the control panel, battery pack, and other circuitry.

Referring now to FIG. 6, a side view of the enclosure IF, with the rear access door 7F open is shown. The door is secured by a hinge 12F, and two mounting holes 11Fa–11Fb are provided for door mounting. These holes are filled by plastic plugs if they are not used. A keylock 2F and locking finger 10F, are provided for security so that unauthorized users may not manipulate the control panel 3F, and other electronics. A strain relief 5F, is provided to secure outgoing connections if any, through the small cutout 13F in the rear access door. The speaker and motion sensor electronics attach to the control panel via cables 4F. A battery cable and connector 8F, connects to a battery pack 9F, located within the enclosure. The control panel contains virtually all of the critical elements of the SSRPD and was designed to be modular so that it may be sold separately or together with the enclosure. It is attached to the rear access door by four fasteners 6Fa–6Fd two at the top of the door, and two at the bottom of the door.

Figure 7:
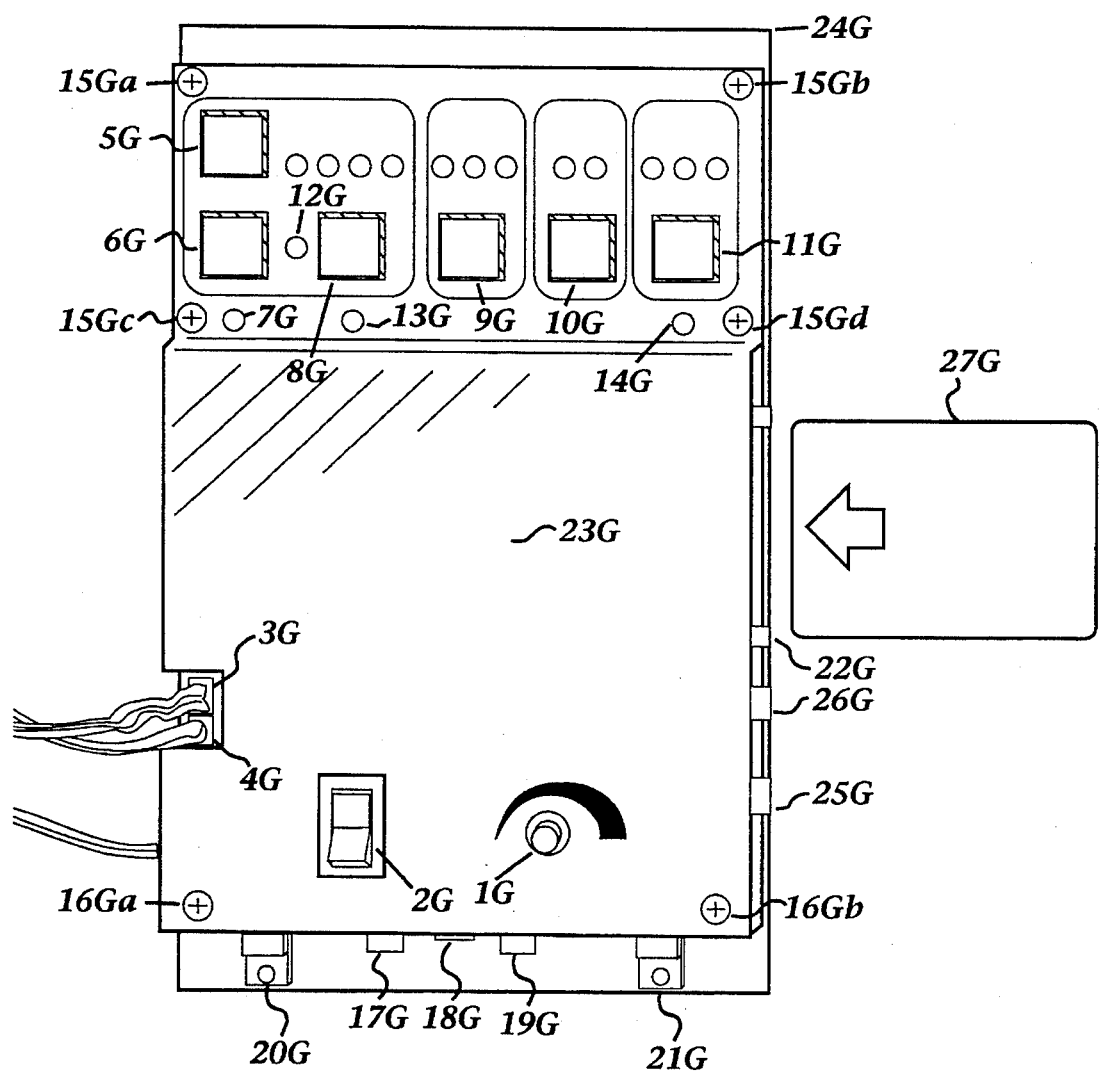
FIG. 7 is a view in perspective of the SSRPD control panel.

FIG. 7 illustrates the SSRPD control panel. The panel is comprised of; keyboard switches 5G, 6G, 8G–11G, display light emitting diodes (LEDs) 7G, 13G, 14G, and 12G (12G consists of the 12 LEDs to the right of 5G and one LED to right of 6G), RAM card interface 22G which accepts PSD 27G, audio input connectors 25G and 26G, audio output connector 19G, trigger input connector 17G, input power connector 18G, power/reset switch 2G, volume control 1G, speaker connector 4G, motion sensor input connector 3G, as well as all of the control panel electronic circuitry which includes power amplifier 20G, and voltage regulator 21G. The panel cover 23G, is secured to the back panel 24G via fasteners 15Ga– 15Gd and 16Ga and 16Gb. The control panel may be built into other devices such as robots, advertising displays, message on hold devices, animatronics, paging systems, safety devices, kiosks, and the like. Other mechanical forms of the control panel such as rack mount versions, may also be constructed.

Referring now to FIGS. 9 and 10, a reference schematic diagram of the SSRPD will be briefly discussed here. Many of the functions described in FIG. 3, have been combined with other functions or omitted for this preferred embodiment. U14 is an audio RPM VLSI which uses ADPCM as the method of A/D and D/A conversion. Audio inputs are provided by microphone input connector P8, and line level input connector P9. This arrangement permits microphone and line mixing. Audio outputs are provided by power amplifier U16, and speaker output connector P8, and by line amplifier U15, and line output connector P9. Micro-controller U6, is the brain of this SSRPD and provides all of the major control of the SSRPD. There is only one bus in this embodiment and it is controlled by U6. The message data is passed via the bus from U14 to U6 and then to the resident memory U8.

In this way control, trigger information, offset correction, and other information may all be stored in a single resident memory. Because of the bus architecture, U8 and the PSD interface may be expanded to accommodate larger memory sizes. For example, one may want to expand memory to permit longer message times. FIG. 10 shows that a 128K×8 Byte RAM could be installed into the U8 IC socket as well a 512K×8 Byte RAM, thus expanding memory by a factor of four. The PSD interface shown permits up to 2M×16 Bytes of memory. The bus architecture of this embodiment actually permits further expansion of resident memory and PSD size with simple modifications.

U6 may be programmed to perform any special functions since it is a computer on a chip. User specified control commands may be inputted via the keyboard switches S3–S6. The U1 circuitry is used to convert the analog motion sensor SN1 to a digital form. An external trigger connector P4, may be used in conjunction with or instead of the motion sensor. External trigger sources are countless and may include but are not limited to; a simple relay or switch closure, open collector or drain transistor, motion sensor, or a shorting plug for message and playback looping. The sensitivity of this and the motion sensor trigger may be easily adjusted by the SSRPD under software control, and without additional circuitry by sampling trigger sources via the micro-controller software. By comparing sampled values to a predetermined set of criteria numerous trigger scenarios may be achieved. The SSRPD may be Operated on batteries via P3, external direct current (DC), or external alternating current (AC) adaptor via P5.

The SSRPD also has the ability to operate in a low power active sleep mode. This is useful for extending battery life. In this mode, user defined criteria causes the SSRPD to shutdown all unnecessary circuitry and the micro-controller waits for a trigger. If desired, it may be placed in a sleep mode, wait mode or slow down its clock rate to further reduce power consumption. When a trigger occurs, an interrupt signals the micro-controller which begins the sampling procedure to verify whether or not it meets the criteria. If it does not meet the criteria, the micro-controller stays or reverts to the low power state. If it does meet the trigger criteria, the micro-controller executes the playback procedure then reverts to the low power state. The user may also setup time intervals which define an amount of time that if no trigger is detected, the SSRPD will go to its low power active sleep mode. U2, U7, U12, Q2, Q5, and their related circuitry facilitate interrupt logic which may interrupt U6 and enable wake up as well as alert U6 to perform a safe shutdown if a low voltage condition occurs.

U5 provides the display driver for LEDs D1–D16 and U4 drives the other two LEDs D14–D15. All of the display functions are under software control of U6. In this way display changes for various features and functions may be made via software as opposed to requiring changes to the circuit hardware. U4 is an output latch which performs internal control via the bus. It may easily be adapted or more latches added, to provide control of other external devices as well. The bus architecture also handles the external PSD interface P7 for the portable storage device. This interface may also be used as a parallel external digital interface.

Figures 1, 12:
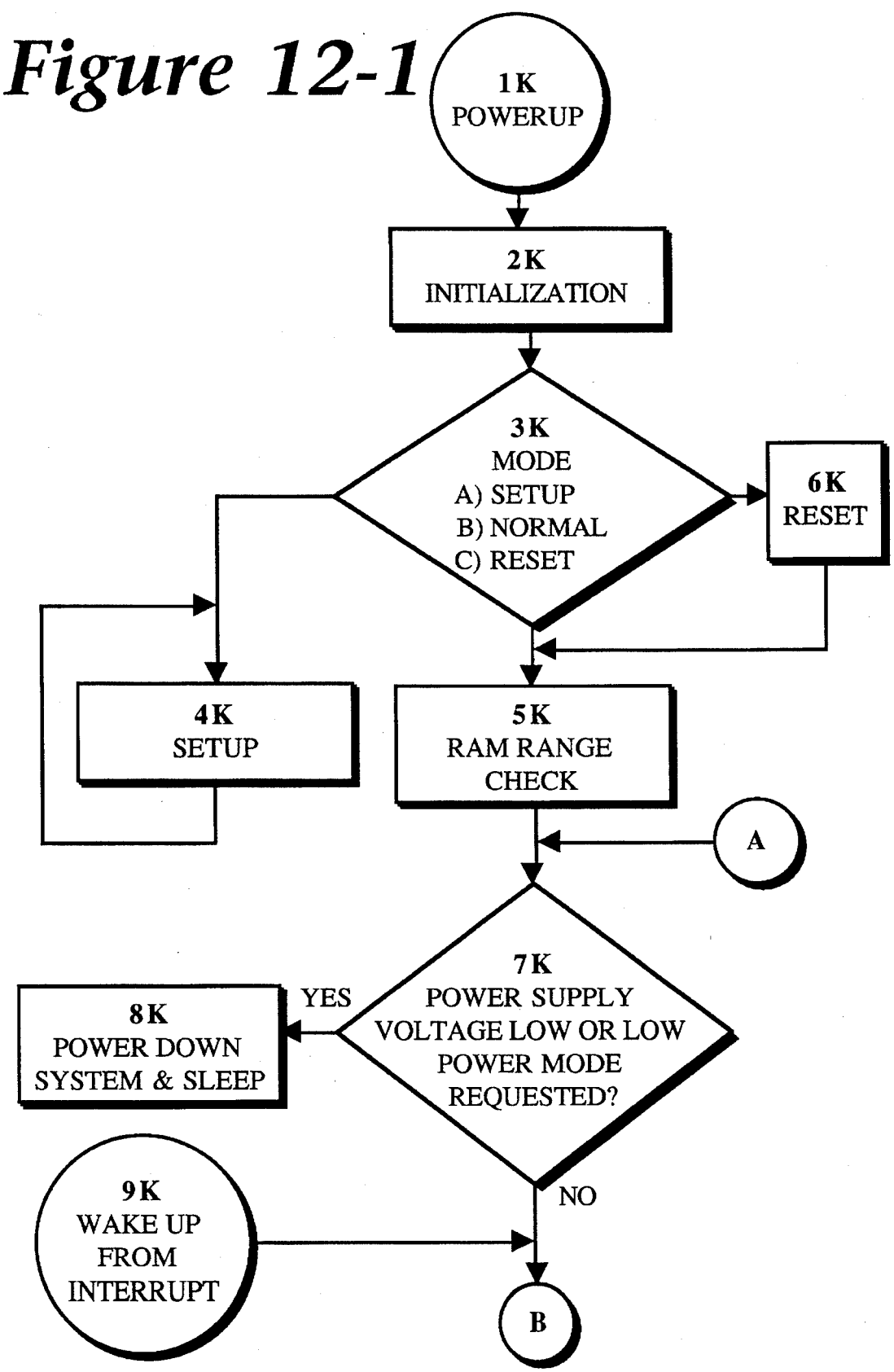
FIG. 12 is a high level software flow diagram for the SSRPD.
Figures 2, 12:
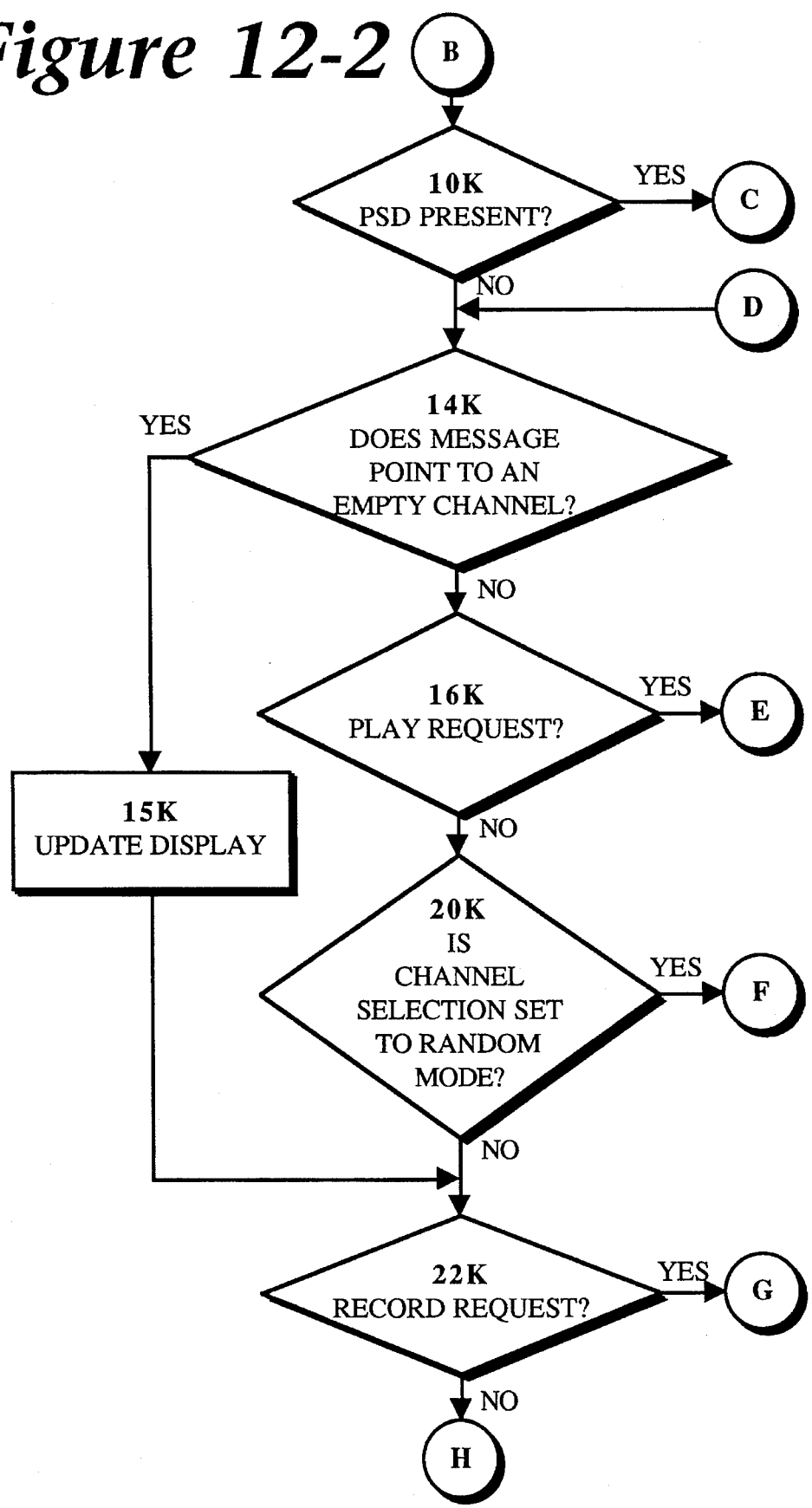
Figures 3, 12:
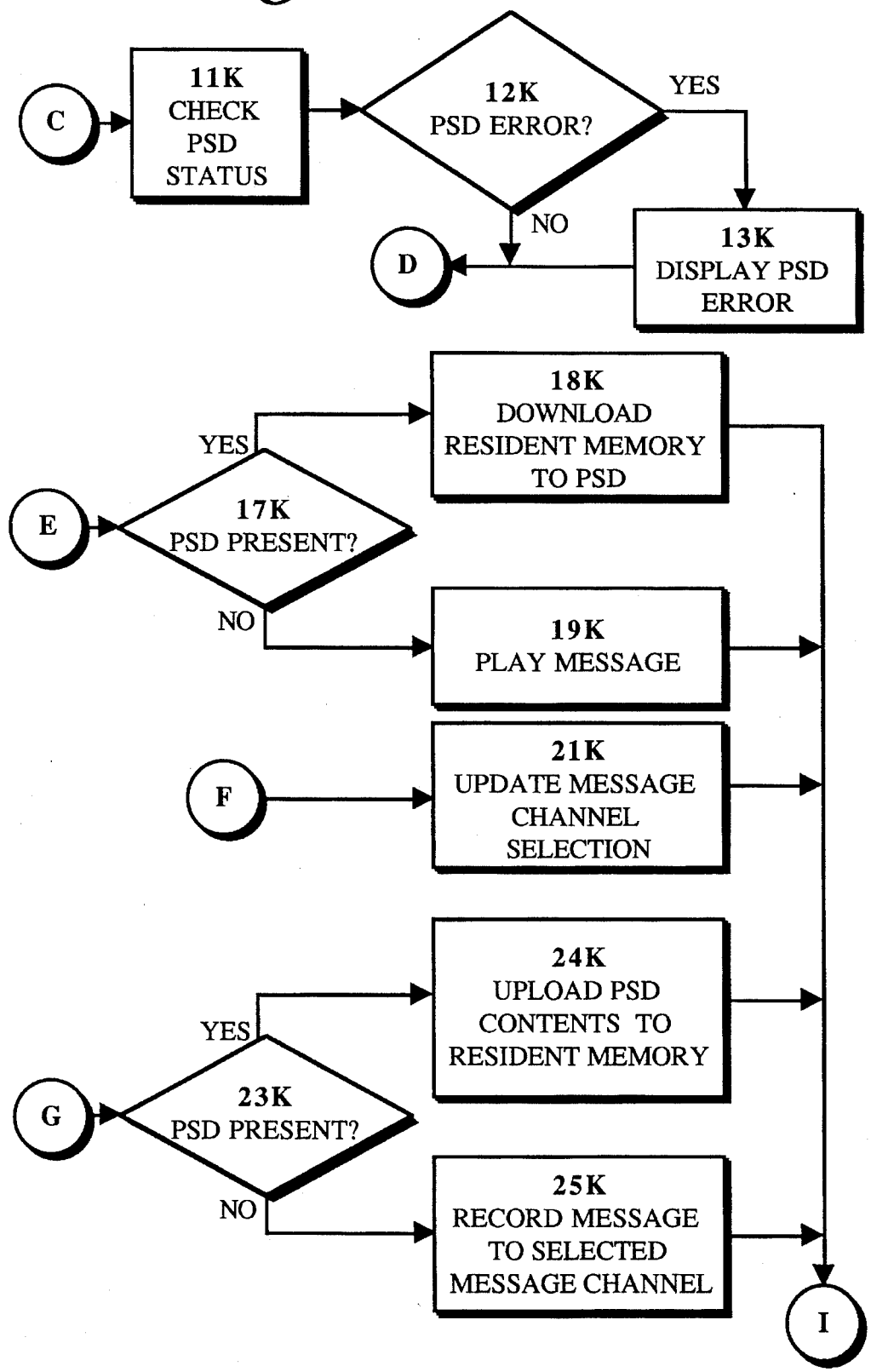
Figures 4, 12:
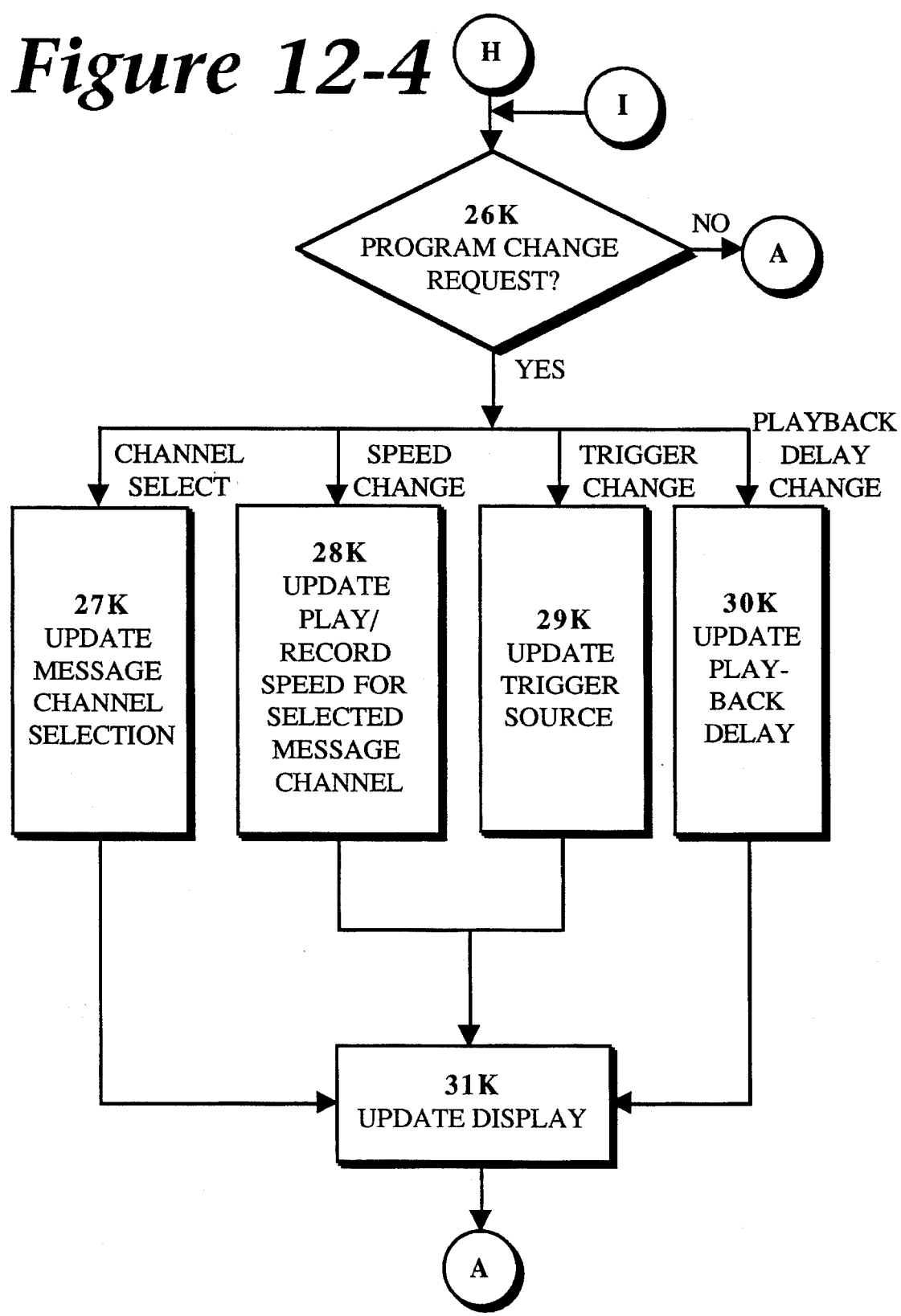

Referring now to FIG. 12, a high level software flow diagram for the reference schematic is illustrated. Upon power up 1K, the SSRPD performs an initialization procedure 2K. After initialization, the SSRPD will enter a mode of operation 3K. In the setup 4K mode, the settings such as playback delays, program inputs, synchronization modes, and the like may be specified. In the reset mode 6K, parameters are returned to default states and self diagnostic routines are performed. In the normal mode, a RAM range check 5K may be performed to determine the size(s) of the SSRPD memory(s). This is extremely useful since the SSRPD is designed with the capability of expanding memory capacity. With the range check feature, the SSRPD automatically determines the size of memory available and uses this information for establishing such parameters as the end of memory address. The SSRPD then checks to see if proper power is available to continue, or a low power request has been made 7K. If yes, then the micro-controller will power down the system and place it in a low-power active sleep mode 8K. In this mode however, the SSRPD may still monitor events via its interrupt control circuitry.

If an interrupt occurs 9K, from say a qualified trigger input, the micro-controller will wake up the SSRPD. A check to see if a PSD 10K is present follows block 7K and/or 9K. If a PSD is sensed, a check of the PSD status 11K, is performed. Tests such as PSD battery status, write protection, and the like are performed. If there is a PSD error or condition that will not permit transfer 12K, the error and/or condition is displayed 13K. If the PSD condition is acceptable, the message pointer is checked to see if it points to an empty channel 14K. If it does, an update message 15K, is performed followed by a jump to 22K, which will be discussed later. If it does not, a check for a play request 16K is performed. If a play request such as a qualified trigger or keyboard play request has been issued, a check for PSD presence 17K is performed.

If the PSD is present, a download to the PSD from the SSRPD resident memory is performed 18K. If the PSD is not present, the message at the message pointer setting is played 19K, and a jump is made to 26K. If there is no play request 16K, then a check for the random play mode is performed 20K. In this mode, the SSRPD scans through the total number of messages and when a qualified trigger is detected, it plays the message that the message pointer happens to point to Therefore, if random play mode is set, the message channel selection is changed based a set number of passes through path 21K, and a jump is made to 26K. If the random mode is not set, a check for a record request is performed 22K. If a record request was made, a check for PSD presence 23K is performed.

If the PSD is present, an upload of the PSD to the SSRPD resident memory is performed 24K, and then a PSD memory range check is performed to determine if uploaded information is within reasonable limits. When parameters are not within reasonable limits, they are assigned default values. If the PSD is not present, the message at the message pointer setting is recorded 25K, and a jump is made to 26K. If no record request was issued in 22K, or the jump was taken to 26K, a check for a program change request 26K is performed. If no program change was requested, a branch is made back to 7K. If a program change is requested, the corresponding request of updating the message channel selection 27K, message speed (sampling rate) 28K, trigger source 29K, or playback delay 30K, is performed. The display is then updated 31K, and a branch is made back to 7K.

The ability of the user to make program changes, provides a great number of options. For example, the playback delay allows the SSRPD to wait for certain time intervals before looking for a valid trigger. This is useful when using the motion sensor or an external trigger. As an illustration, consider a department store advertisement display where one may not want to playback the same message every time a person walks by. The location of the display with the SSRPD may be at a busy section of the store. Both sales people and customers might become annoyed with the constant repetition of the same message. A good solution would be to record several different messages and setup a playback delay of say five minutes. Now with the SSRPD in random play, the most the unit will play back is twelve times in an hour and the customers will most likely hear a variety of messages.

The same is true for the trigger source. One may choose between the motion sensor, external trigger, or both. In the case of the external trigger, one option is to use a shorting plug which constantly triggers the SSRPD. If there were no playback delay, then the SSRPD could perform message looping, whereby after a message has Completed playback, it immediately repeats over again indefinitely. Once again however, introducing a playback delay would space the looping times apart. One could also use the random message mode as in the previous example. An example of where this would be useful is an airport loading zone, where one needs to continually annunciate that: "This area is only for loading and unloading, and there is no parking permitted."

Message' sampling rates may also be set with the SSRPD. Recording at higher sampling rates results in better quality recordings at the expense of shorter message length. Conversely, lower sampling rates provide longer message lengths at the expense of lower quality audio performance. This SSRPD allows the user to record a number of messages each at different sampling rates. The only limiting factor is the memory space. For example, one may have four messages. Each may be recorded at whatever speed i.e., sampling rate, one desire. If however, one finds that one's last message cannot fit at the highest Speed, one simply drops to the next lowest setting and tries again. The SSRPD will even allow one to playback at a different speed than the speed at which the message was recorded. This makes messages recorded at slower speeds sound higher pitched when played back at higher speeds. Conversely, it makes messages recorded at higher speeds sound lower pitched when played back at lower speeds. These effects often may be useful as well as humorous. There are many other program possibilities with the SSRPD. Because the SSRPD is controlled by a micro-controller changes to the program code may be made and the newly coded micro-controller may replace the previous one. In this embodiment both the micro-controller IC and memory IC are mounted into sockets so that they may be easily replaced.

Referring again to FIG. 10, a preferred form of the PSD device which connects to P7, will be described. A RAM card or Flash EEPROM card containing non-volatile memory is used to copy the SSRPD resident memory U8, to the PSD. By writing bytes and reading them back, micro-controller 06 may automatically determine the size of the PSD. Since the transfer is digital and is clocked at a very fast rate, the time of transfer to and from a PSD is generally much faster and more efficient than an analog transfer. There are no cables, cassettes, or tape machines involved with this transfer. In addition, the transfer is lossless and without degradation making the PSD feature a major improvement over currently available methods and devices. The PSD may be used over and over again and one recorded PSD may load virtually an unlimited number of SSRPDs.

Figure 8A:
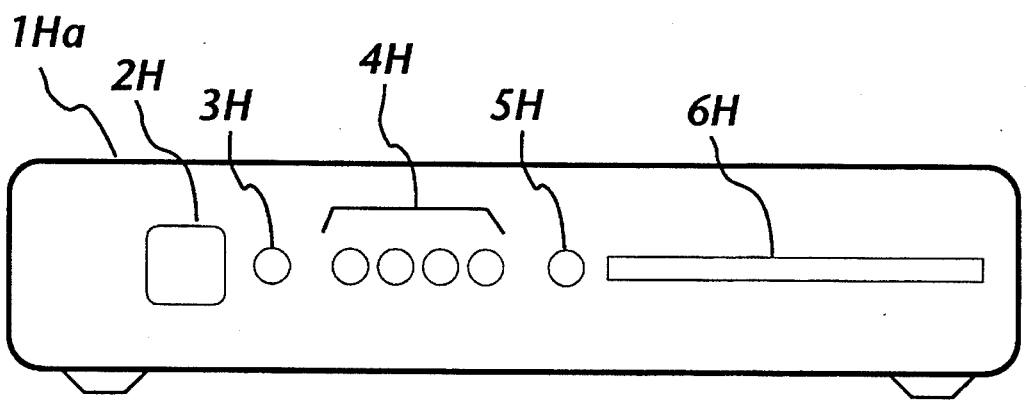
FIGS. 8A and 8B are views in perspective of the computer interface device in accordance with this invention.
Figure 8B:
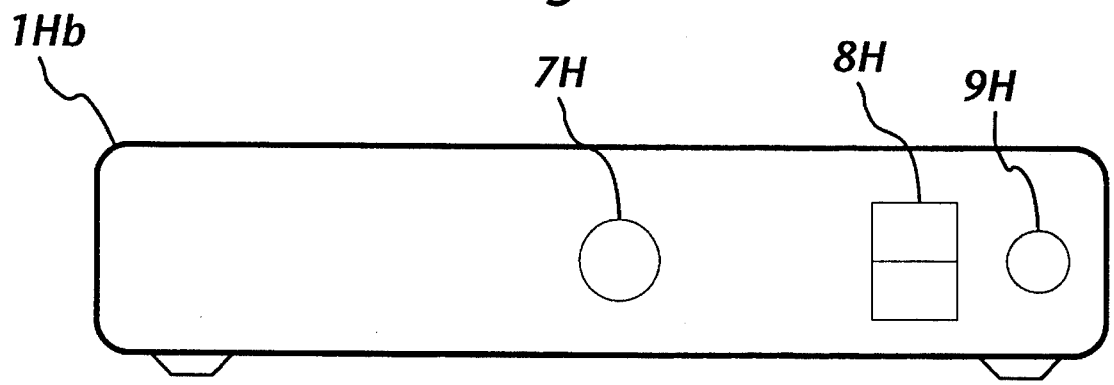

Referring to FIGS. 8A and 8B, a preferred form of the CID enclosure is shown. The enclosure front view 1H*a*, and rear view. 1H*b* will be discussed here. Interrupt switch 2H, power LED 3H, communication display 4H, RAM card LED 5H, and RAM card connector, are located on the front of the enclosure. Power input 9H, power switch 8H, and terminal serial connector 7H, are located on the rear panel.

Figures 1, 13:
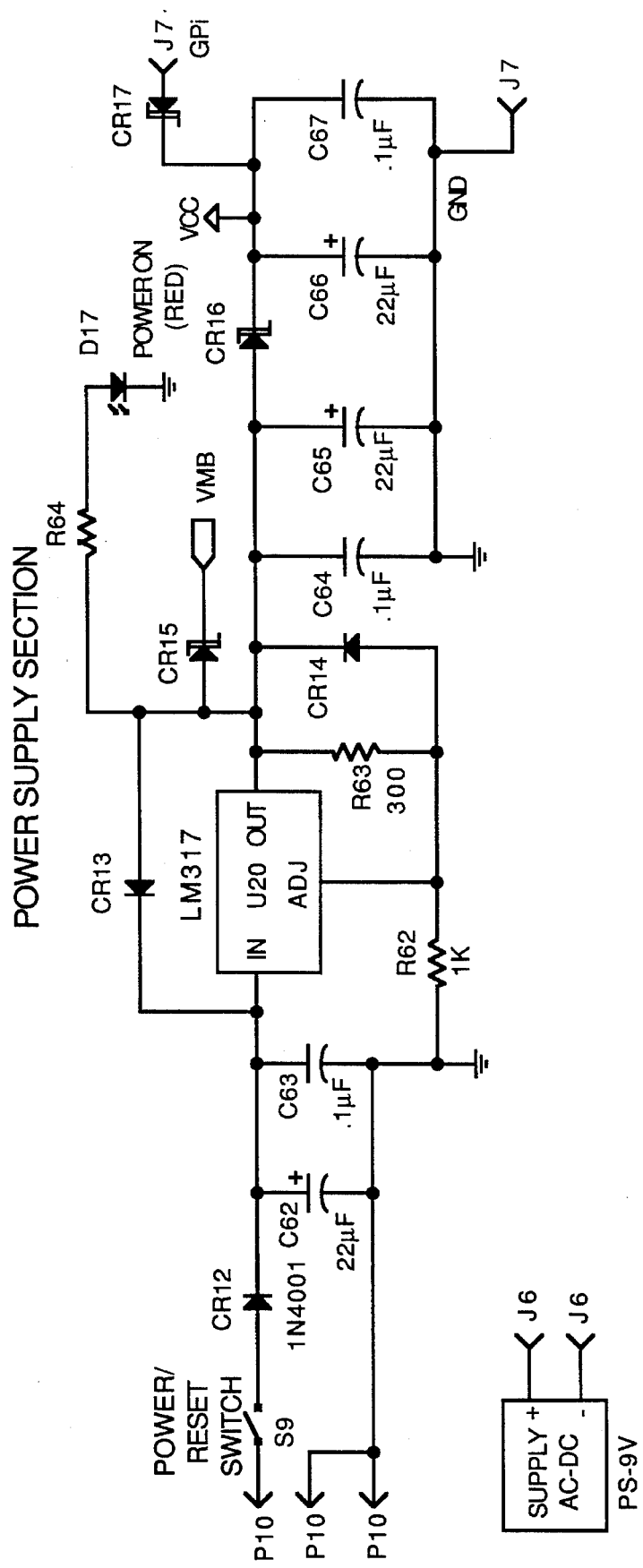
FIG. 13 is a schematic diagram of a preferred embodiment of the CID.
Figures 2, 13:
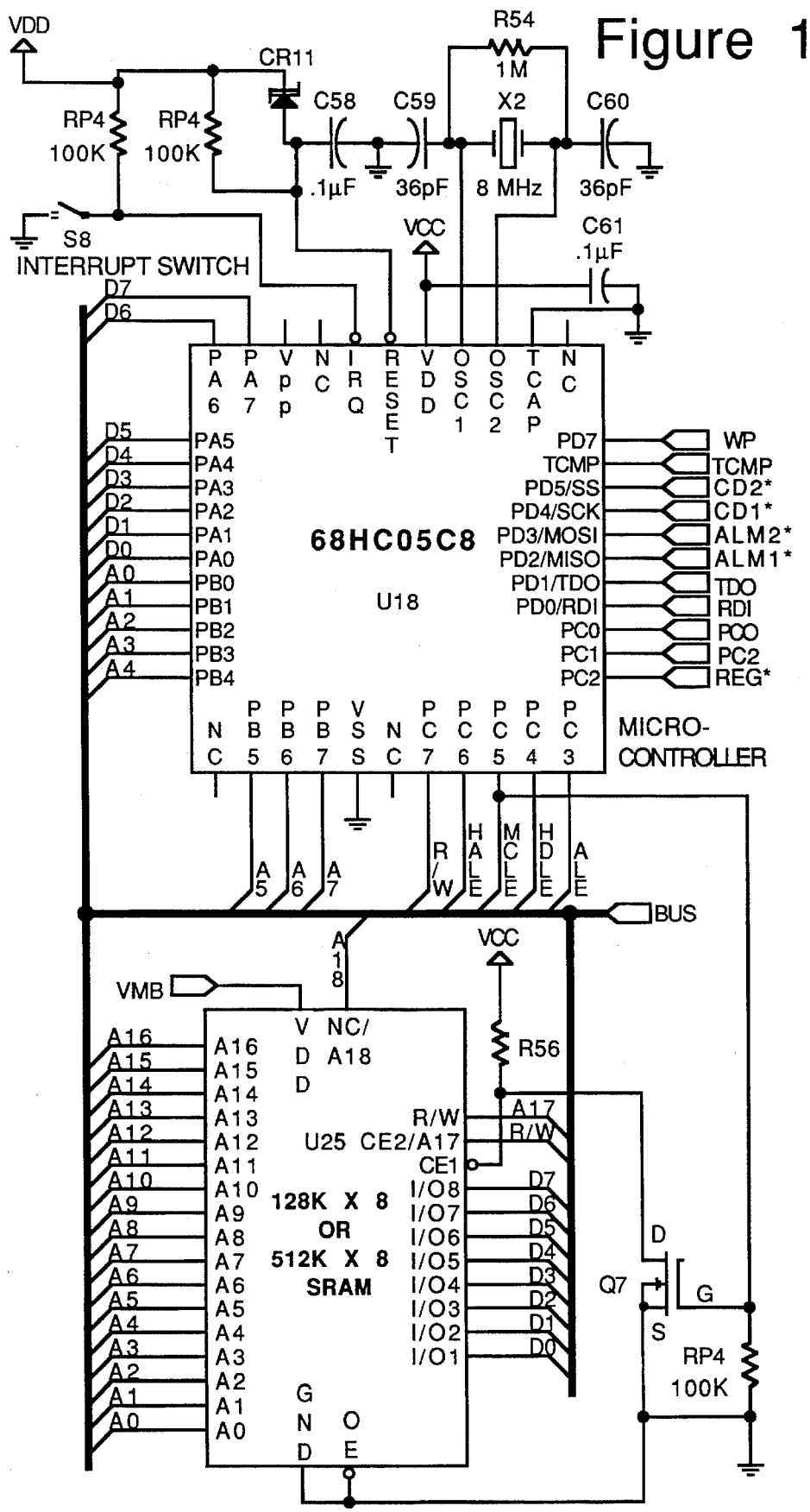
Figures 3, 13:
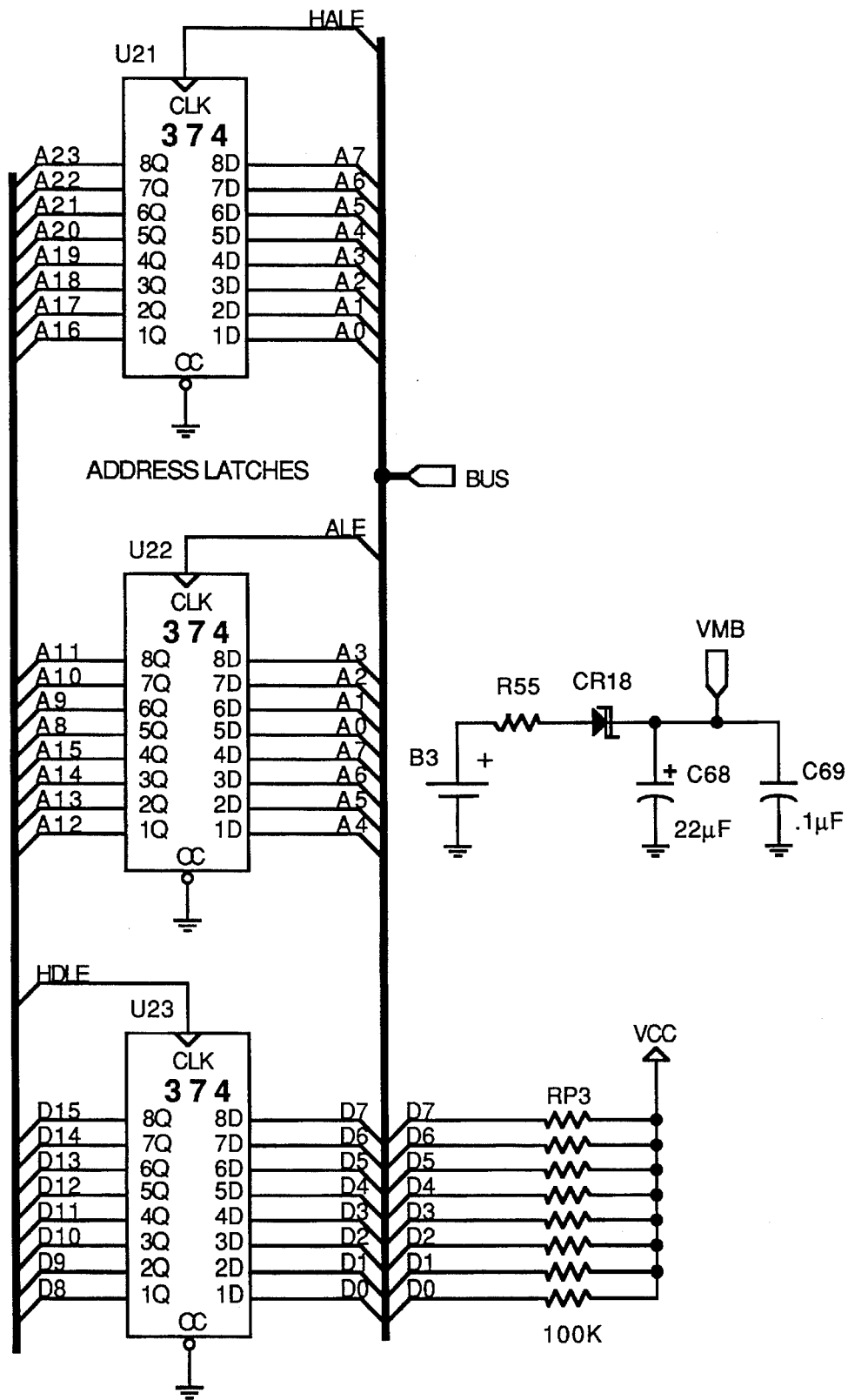
Figures 4, 13:
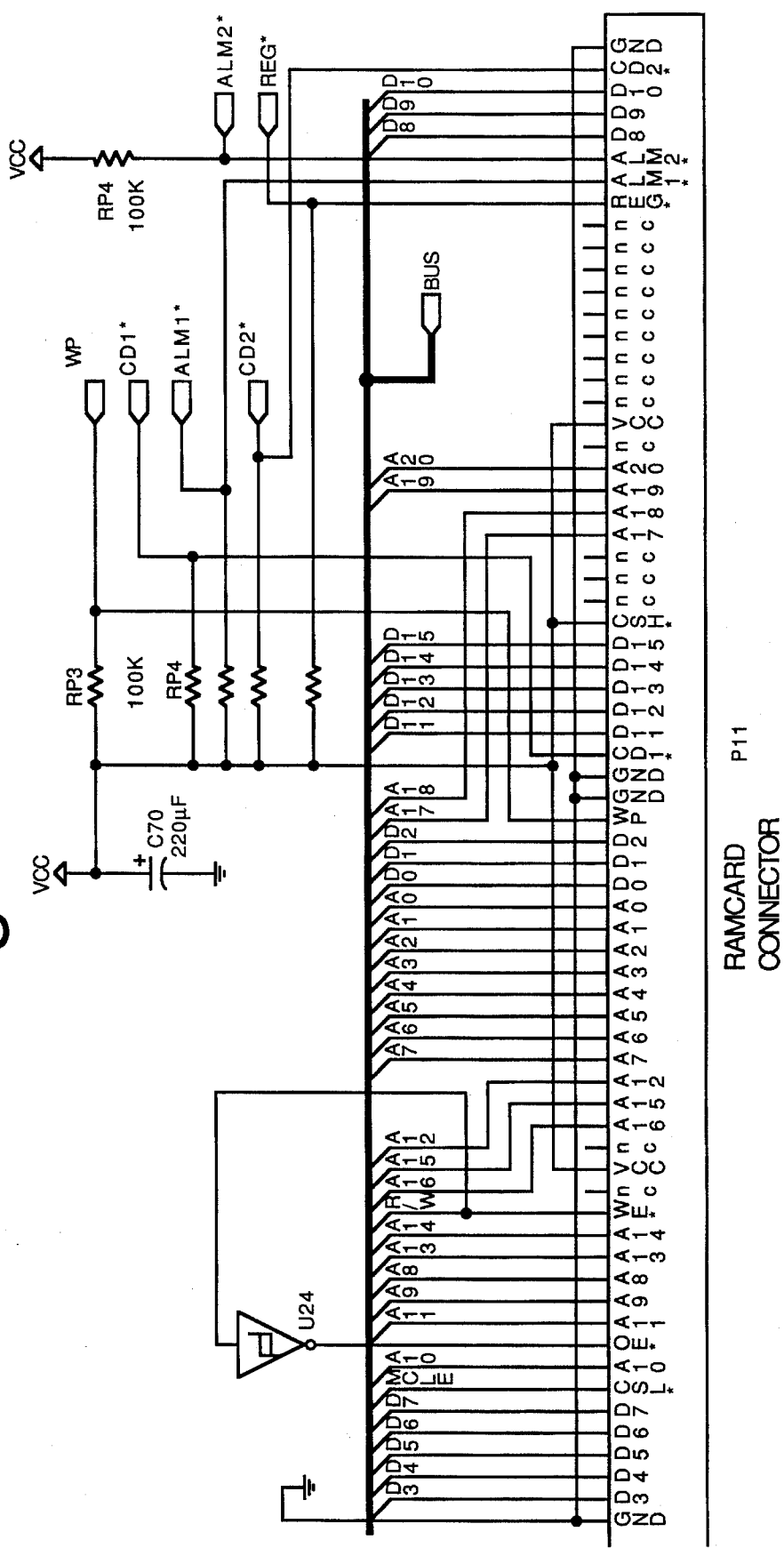
Figures 5, 13:
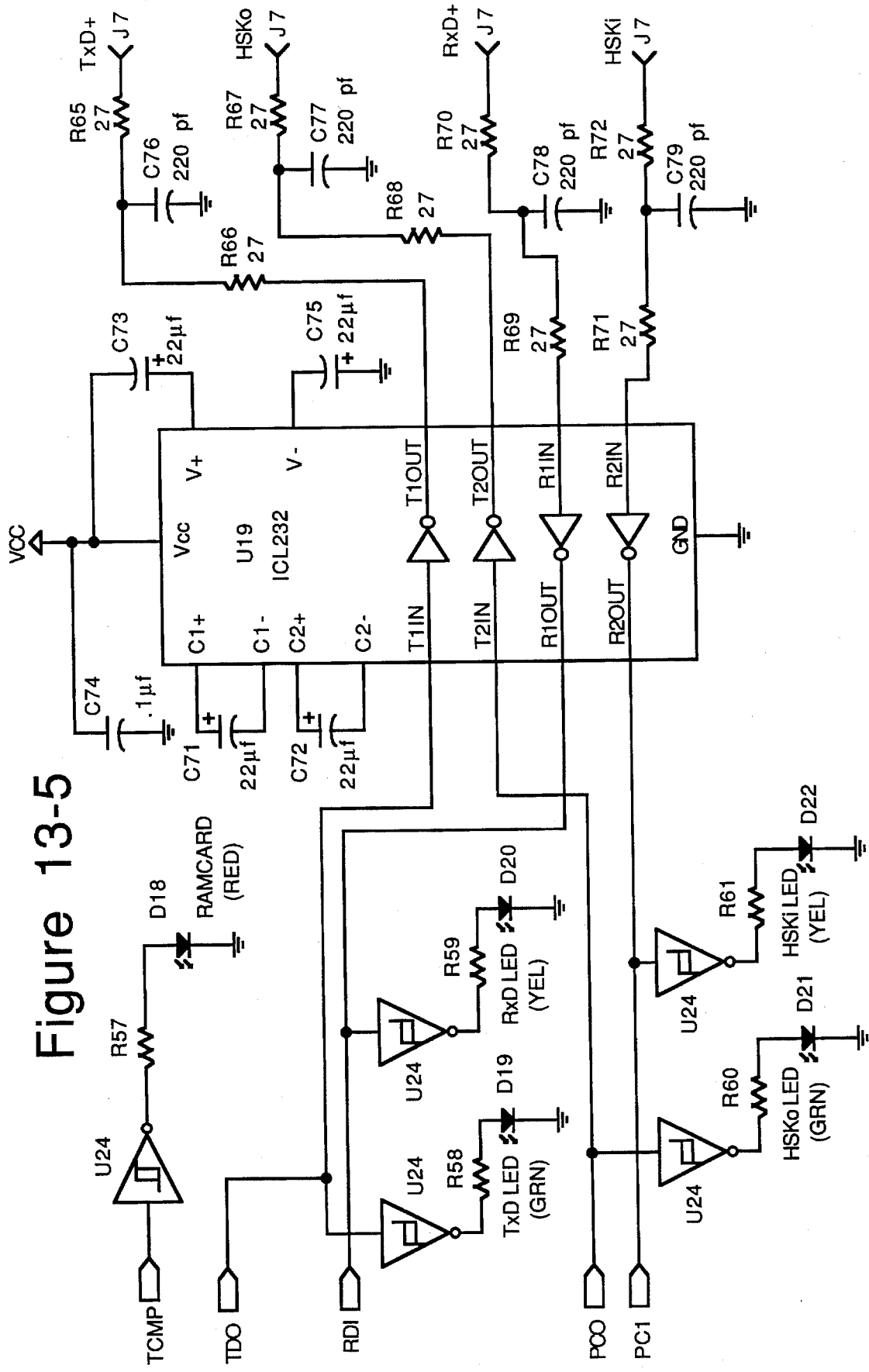

Referring now to FIG. 13, a reference schematic diagram of a preferred embodiment of the computer interface device is shown. The CID may be used to read from PSDs as well as write to them. The brain of the CID is micro-controller U18. It controls all of the CID functions either directly or through the address and data bus. Latches U21–U23 allow the micro-controller to expand its address and data range for the PSD and resident memory. Additional latch circuitry may be added to further expand address and data capability. Although the micro-controller contains its own internal RAM which could be used for buffer memory, additional resident memory U25, has also been provided to serve as a larger buffer and archive memory. Configuration settings and other data may also be stored in U25. Back-up battery B3 is used to provide memory retention when power is removed. A Flash EEPROM may be used instead of the SRAM. In this case the B3 circuitry would not be needed. The bus architecture permits expansion of both resident and PSD memory. RAM card connector P11, is used to interface to a RAM card or Flash EEPROM card.

This interface handles the transfer of data between the micro-controller and the PSD. It also allows the micro-controller to perform diagnostic and status routines such as memory-segment tests, back-up battery status, write-protect status, and the like. Data editing and manipulation may also be performed. Examples of other-routines include but are not limited to; a background noise during record may be removed, computer recorded sound bytes may be inserted, message order may be changed, and control information may be modified. Since the P12 interface is the same as the PSD interface on the preferred SSRPD, a connection between the CID and SSRPD may be made and diagnostic routines on the SSRPD may also be performed.

The CID is and intelligent device with a standard serial RS-232 interface provided by U19. The micro-controller recognizes an ASCII command and control set, and writes ASCII characters back to the host. Because it is an intelligent device a dumb terminal may be as the host. A computer with mass-storage may be more desirable when archiving of numerous PSDs is desired.

Figures 1, 14:
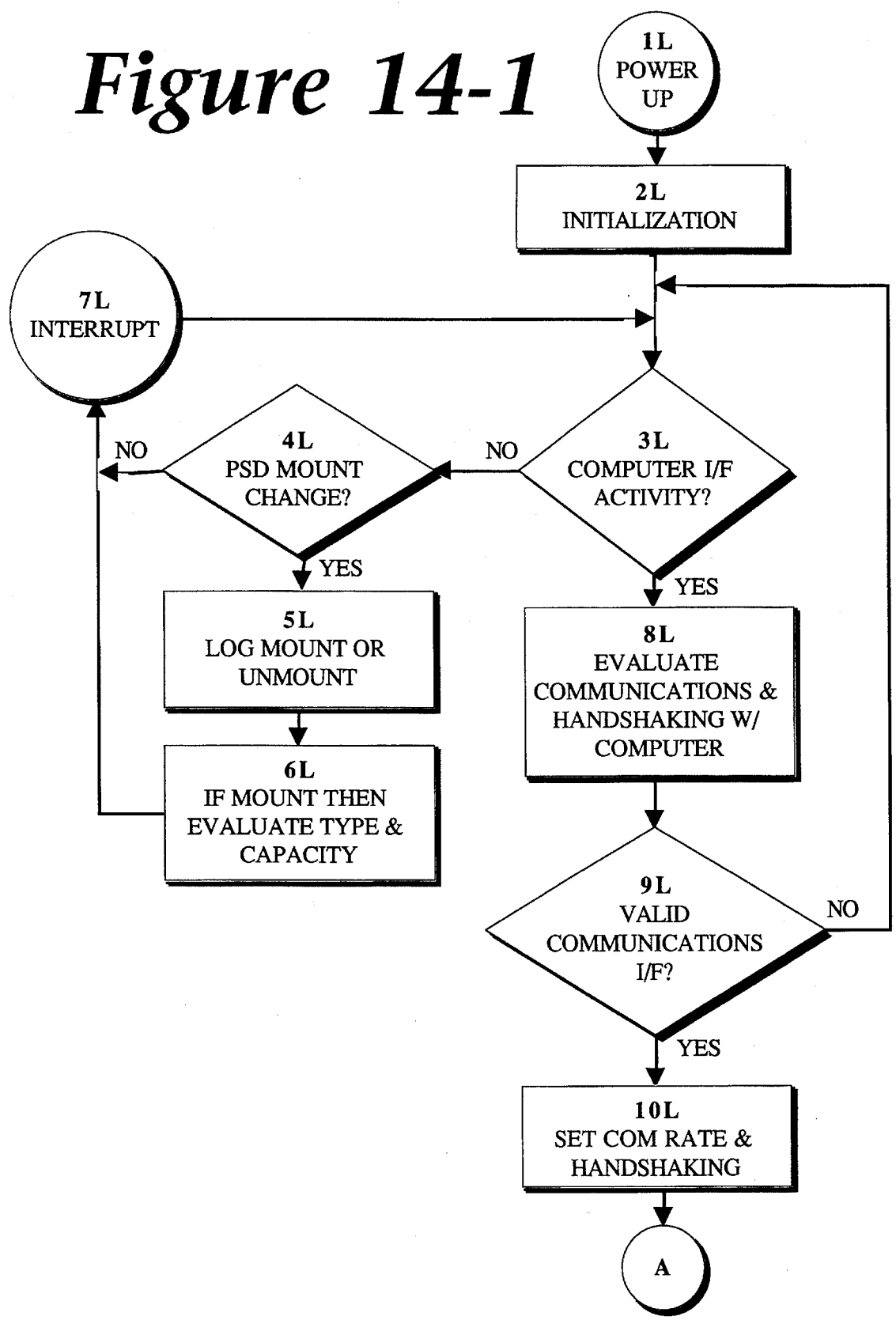
FIG. 14 is a software flow diagram for the computer interface device.
Figures 2, 14:
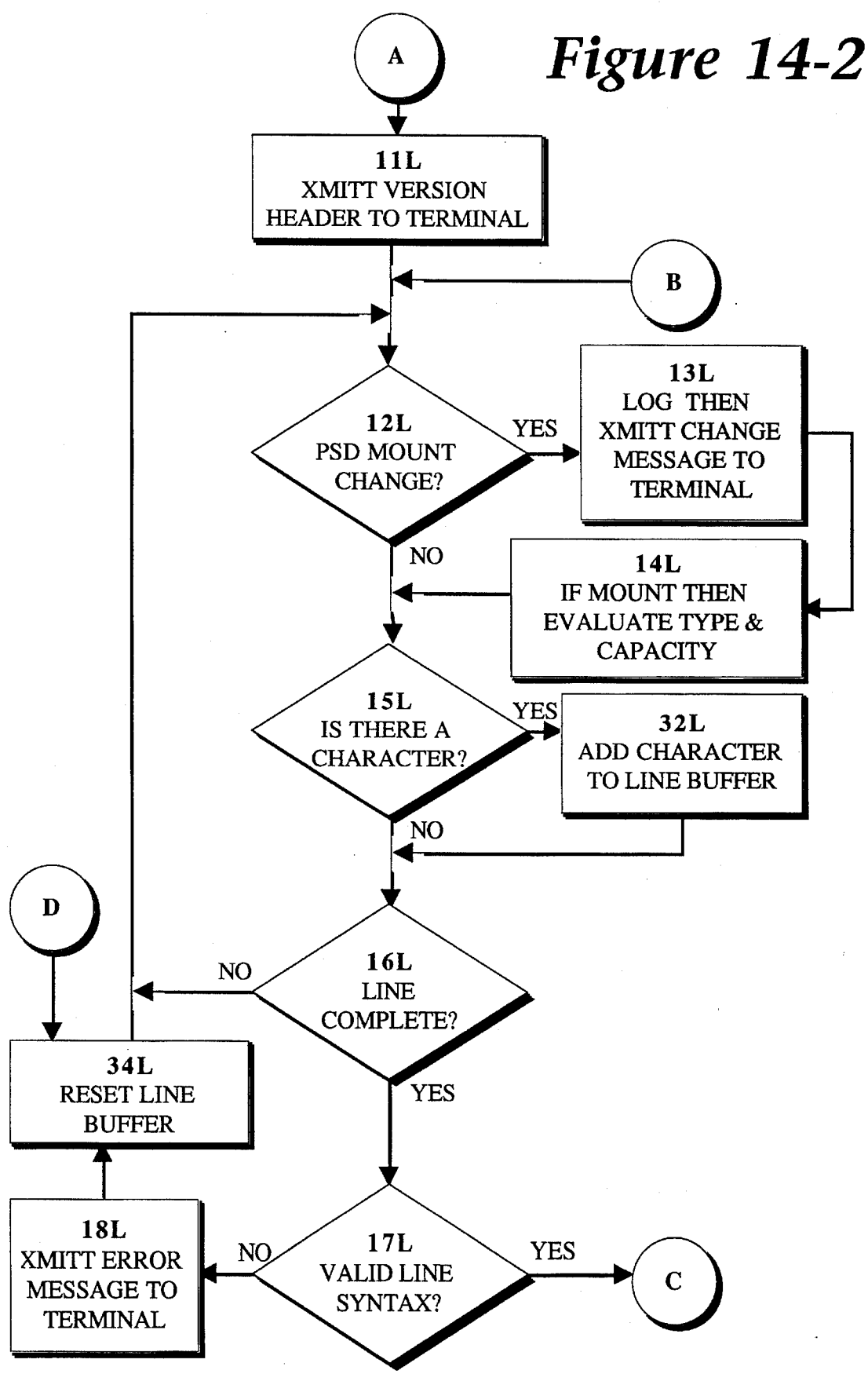
Figures 3, 14:
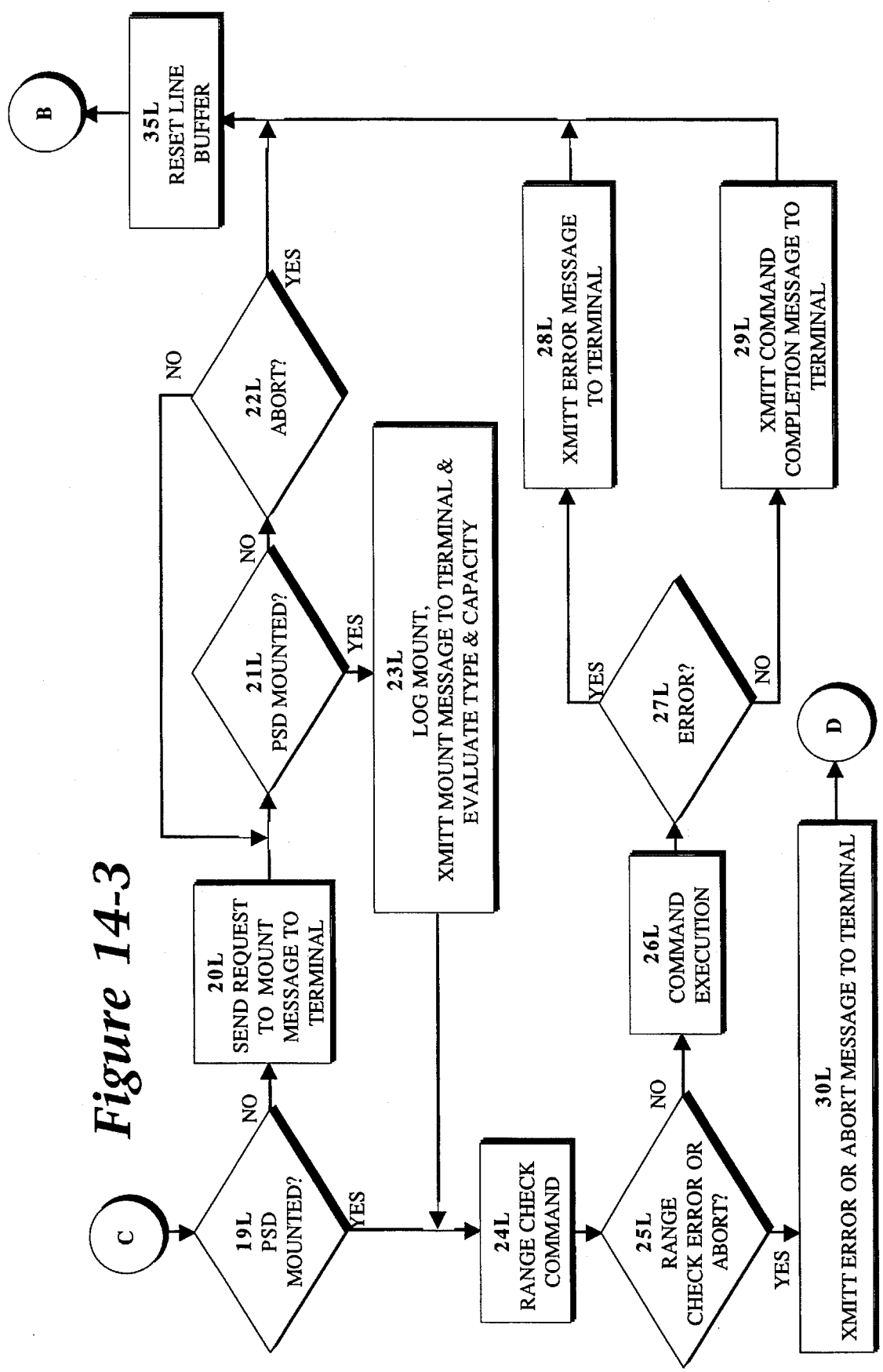

Referring now to FIG. 14, a software flow diagram for the CID is shown and will be discussed here in detail. When the CID is powered up or reset 1L, it goes through an initialization procedure which clears certain variables and resets others to their default condition. Next the CID checks its computer interface to see if there is activity there 3L. If there is not it then checks the PSD interface to see if there has been a change in the PSD mount 4L, e.g., RAM card inserted or removed. If not, the program jumps to the block 3L. An interrupt 7L, which may result from the user pressing the interrupt switch, interrupts the controller operation in process, and vectors to a known position 3L, without clearing variables. If there is a mount change in 4L, the program will log the mount or unmount event 5L. If a PSD was mounted then the CID will evaluate the type of PSD and its capacity 6L. For example, it may determine that the PSD is a RAM card with a capacity of 512K×8 Bytes. The program then will jump to block 3L.

If in step 3L, there is computer interface activity, the program proceeds to step 8L, where it will analyze the bit stream by measuring mark and space time widths, to determine baud rate, parity, and the number of bits. Handshaking requirements are then determined by monitoring the handshake input line with the host computer or terminal. It will then verify if the communications are valid 9L. If not a branch is made to block 3L. If communications are valid, the program will set the communication rate e.g., baud rate, and handshaking 10L. Next, the program will transmit to the host terminal a header 11L, which tells the user among other things, which version of CID hardware and software is being used.

Another check is made to see if the PSD mount has changed 12L. If there has been a change the change is logged, and a corresponding message is sent to the terminal 13L. If a PSD was mounted then the CID will evaluate the type of PSD and its capacity 14L. The program then jumps to block 15L. If there was no PSD mount change in 12L, it would also arrive at this same point. Next, the program checks to see if has received a character 15L. If it has, the character is added to a line buffer 32L. In either case the program proceeds to 16L, where a check to see if a carriage return character has been received to complete a line. If not, the program branches to block 12L. If the line is complete, it is checked for valid syntax 17L. If the syntax is not valid, an error message is transmitted to the terminal 18L, the line buffer is reset 34L, and the program jumps to 12L. If the line syntax was valid in 17L, a check to verify that the PSD is mounted is made 19L. If it is mounted, a check command is issued and performed 24L. Range check commands include but are not limited to; "Read" PSD start and end address, "MMRead"—read using the SSRPD format, "Display" memory contents at a given start and end address, "Modify" PSD memory location(s), and "BF"—block fill a defined address range with specified data values.

Next, the range command is tested for error or if there was an abort of the operation 25L. If there was error or abort, an error or abort message is transmitted to the terminal 30L, and step 34L, which resets the line buffer is executed., followed by a jump to 12L. If there was no error or abort in 25L, the command is executed 26L. The execution of the command is then checked for error 27L. If there was error, an error message is transmitted to the terminal 28L, and step 35L, which resets the line buffer is executed, followed by a jump to 12L. If there was no error in 27L, a command complete message 29L, is sent to the terminal, followed by step 35L.

If in step 19L, the PSD was not mounted, a message is sent to the terminal requesting that the user mount the PSD 20L. A check is then performed to see if the PSD has been mounted 21L. If it has, the mount is logged, a message that the PSD is mounted is transmitted to the terminal, and an evaluation of the PSD type and capacity is performed 23L, followed by step 24L. If the PSD is not mounted in 21L, a check for an abort from the keyboard 22L is performed. If no abort was performed a branch back to 21L is made. If an abort was performed the line buffer is reset 35L, followed by a jump to 12L. Command examples are shown in block 36L, which represents functions and commands that are evaluated in 24L, and executed in 26L. The command set is intended to be expanded upon and capabilities increased. This limited set however, is given for clearer illustration of the preferred embodiment.

It will be apparent to those skilled in the art that many variations and changes may be made based on the details set forth in the above description. These changes or variations, to the extent that they are based on the above detailed disclosure, are intended to come within the scope of the claims herein presented.

We claim:

1. A solid-state record/playback system for recording and playing back information such as audio, video, control information or internal control and for control of external devices and other data and combinations thereof comprising:

at least one solid-state record/playback device having multiple inputs and multiple outputs and including: at least one resident record/playback memory for storing information, and a record/playback module, and a record/playback controller module;

said information including at least audio and control information for internal control and for control of external devices;

said record/playback module and said record/playback controller module being operatively connected to record/playback module bus means;

said record/playback module being operative to perform record signal conversion and playback signal conversion;

means connected to said record/playback module bus means to receive said information from and to transfer said information to a portable digital transfer means;

digital portable transfer means for transferring said information to and optionally receiving said information from said solid-state record/playback device whereby said information may be inputted to at least one solid-state record/playback device or received therefrom for inputting into other solid-state record/playback devices.

2. A solid-state record/playback system as set forth in claim 1, wherein said solid-state record/playback system includes a plurality of solid-state record/playback devices, and said digital portable transfer means being adapted to transfer information to each of said solid-state record/playback devices.

3. A solid-state record/playback system as set forth in claim 1 wherein said solid-state record/playback device includes a motion sensor input and an audio output.

4. A solid-state record/playback system as set forth in claim 1 wherein said solid-state record/playback device is battery operated and includes means to provide a low power active sleep mode.

5. A solid-state record/playback system as set forth in claim 1 wherein said solid-state record/playback module includes an audio record/playback module in which a DC offset voltage exists; and means to generate record and playback correction values for correcting the DC offset voltage.

6. A solid-state record/playback system as set forth in claim 1 further including:

an intelligent interface device adapted to communicate with a terminal or computer to perform reading, writing, and editing data in the digital portable transfer means; and said intelligent interface device also being adapted to perform diagnostic procedures on the digital portable transfer means as well as the solid-state record/playback device.

7. A solid-state record/playback system as set forth in claim 1, wherein said record/playback module includes an audio/video record/playback module time and control processor means, and means to effect communication between the time and control processor means and said record/playback controller module.

8. A solid-state record/playback system as set forth in claim 2 wherein said solid-state record/playback device includes an analog to digital converter and a digital to analog converter, and said converters being connected to said time and control processor means and time and control bus means, the latter being connected to said means to effect communication between said time and control processor and said record/playback controller module.

9. A solid-state record/playback device comprising:

solid-state record/playback circuitry which performs record conversions, digital signal compression, digital signal processing, and playback conversion;

internal timing and control processing circuitry;

input and output interface circuitry;

control output processing circuitry for internal control and for control of external devices;

program input processing circuitry for receiving internal control information and information for control of external devices;

record/playback memory means, said record/playback circuitry and said record/playback means being connected to record/playback bus means, and additional data bus means for interfacing said interfacing and processing circuitry and said memory.

10. A solid-state record/playback device as set forth in claim 9 including means to input audio, video, control and other information; and means to output said information.

11. A solid-state record/playback device as set forth in claim 9 including means to input audio and means to output audio in response to a command.

12. A solid-state record/playback device comprising:

a record/playback module;

means in said record/playback module to effect record signal conversion, compression of recording and data, digital signal processing and control output processing;

means to input data into said record/playback module for output thereof in response to a trigger signal of predetermined programmable characteristics;

means to receive an input trigger signal; and means to adjust the sensitivity of the trigger signal whereby said record/playback module responds to a trigger signal of said predetermined programmable characteristics.

13. A solid-state record/playback device as set forth in claim 12 wherein said device is normally in a low power mode and includes:

means to determine the occurrence of said trigger signal at predetermined intervals;

means to sample the trigger signal to determine if there is present said predetermined programmable characteristics;

means operative in response to a trigger signal of said predetermined programmable characteristics to increase the power mode to an operative mode, to output at least some of the data from said record/playback device and thereafter revert to the low power mode.

14. A solid-state record/playback device as set forth in claim 12 further including:

means to transfer information to and from a digital portable transfer device for inputting and outputting information therefrom.

* * * * *